(12) United States Patent
Takahashi

(10) Patent No.: US 7,283,206 B2
(45) Date of Patent: Oct. 16, 2007

(54) PROJECTION OPTICAL SYSTEM, EXPOSURE APPARATUS, AND DEVICE MANUFACTURING METHOD

(75) Inventor: Tomowaki Takahashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/353,005

(22) Filed: Feb. 14, 2006

(65) Prior Publication Data

US 2006/0262277 A1 Nov. 23, 2006

(30) Foreign Application Priority Data

Feb. 15, 2005 (JP) ............... 2005-038401
Nov. 4, 2005 (JP) ............... 2005-320423

(51) Int. Cl.
G03B 27/54 (2006.01)
G03B 27/42 (2006.01)
G02B 5/10 (2006.01)

(52) U.S. Cl. ............... 355/67; 355/53; 359/859
(58) Field of Classification Search ............... 355/52, 355/53, 55, 67; 359/365, 858, 725–731, 359/857, 859
See application file for complete search history.

(56) References Cited

U.S. PATENT DOCUMENTS

| | | | |
|---|---|---|---|
| 4,701,035 A | 10/1987 | Hirose | |
| 5,636,066 A * | 6/1997 | Takahashi | ............... 359/726 |
| 5,686,728 A | 11/1997 | Shafer | |
| 6,172,825 B1 | 1/2001 | Takahashi | |
| 6,556,648 B1 | 4/2003 | Bal et al. | |
| 6,710,917 B2 * | 3/2004 | Mann et al. | ............... 359/365 |
| 6,781,671 B2 | 8/2004 | Komatsuda | |
| 6,995,833 B2 * | 2/2006 | Kato et al. | ............... 355/67 |
| 2004/0012866 A1 | 1/2004 | Mann et al. | |
| 2004/0189968 A1 | 9/2004 | Terasawa | |

FOREIGN PATENT DOCUMENTS

JP 2002-139672 5/2002

* cited by examiner

*Primary Examiner*—Henry Hung Nguyen
(74) *Attorney, Agent, or Firm*—Finnegan, Henderson, Farabow, Garrett & Dunner, L.L.P.

(57) ABSTRACT

A projection optical system has at least eight reflecting mirrors and is relatively compact in the radial direction. The eight reflecting mirrors (M1~M8) form a reduced image of a first surface on a second surface. A first reflecting image forming optical system (G1) forms a first intermediate image (IMI1) of the first surface based on light from the first surface, a second reflecting image forming optical system (G2) forms a second intermediate image (IMI2) of the first surface based on light from the first intermediate image, and a third reflecting image forming optical system (G3) forms a reduced image on the second surface based on light from the second intermediate image. The number of reflecting mirrors (M6~M8) of the third reflecting image forming optical system is greater than the number of reflecting mirrors (M1, M2) of the first reflecting image forming optical system.

24 Claims, 13 Drawing Sheets

PROJECTION OPTICAL SYSTEM, EXPOSURE APPARATUS, AND DEVICE MANUFACTURING METHOD

BACKGROUND OF THE INVENTION

1. Field of the Invention

The present invention relates to a projection optical system, an exposure apparatus, and a device manufacturing method and relates, for example, to a reflecting type projection optical system that is ideal for x-ray projection exposure apparatus that uses x-ray to transfer a circuit pattern on a mask onto a photosensitive substrate by means of a mirror projection system.

2. Description of the Related Art

Exposure apparatus that uses x-ray has gained attention as exposure apparatus used in the fabrication of semiconductor devices, etc. If x-ray is used as the exposure light, the usable transmitting optical materials and refracting optical materials will no longer be present, so, in addition to using a reflecting type mask, a reflecting type projection optical system is used. In the past, 8-mirror reflecting type optical systems consisting of eight reflecting mirrors have been proposed as projection optical systems that can be applied to exposure apparatus that uses x-ray as the exposure light, for example, in the specification of U.S. Pat. No. 6,710,917 (corresponds to Japanese Unexamined Patent Application Publication No. 2002-139672).

The conventional reflecting type projection optical system disclosed in the second working example of U.S. Pat. No. 6,710,917 is a 3 times image forming type optical system that forms intermediate images between a second reflecting mirror and a third reflecting mirror and between a sixth reflecting mirror and a seventh reflecting mirror respectively. In this example, the sixth reflecting mirror is a reflecting mirror that has a reflecting region (usage region) at the position most separated from the optical axis, that is, the reflecting mirror with the largest effective radius. The reflecting surface of this largest sixth reflecting mirror is formed into a spherical shape, so regardless of the fact that the reflecting region is at a position that is relatively greatly separated from the optical axis, it is relatively easy to detect the surface shape of the reflecting surface of the sixth reflecting mirror using an interferometer. In contrast with this, it is not easy to use an interferometer to detect the surface shape of a reflecting surface with an aspheric surface shape at a position that is relatively greatly separated from the optical axis.

However, in the conventional reflecting type projection optical system discussed above, while the maximum object height H0 is 110 mm, the effective radius Mφ of the sixth reflecting mirror, which is the largest, is as much as approximately 400 mm, so the ratio Mφ/H0 of the maximum effective radius Mφ to the maximum object height H0 is approximately 3.66, resulting in an optical system that has become extremely large in the radial direction. In addition, the total length (the object-to-image distance) TT of the optical system is approximately as much as 1956 mm, so the ratio TT/H0 of the total length TT to the maximum object height H0 is approximately 17.8, resulting in an optical system that has become extremely large in the axial direction. In addition, in the conventional reflecting projection optical system discussed above, the image side numerical aperture NA is 0.4, but there are demands to further increase the image side numerical aperture NA to achieve high resolution.

SUMMARY OF THE INVENTION

The present invention takes the aforementioned problems into account, and its purpose is to provide a projection optical system that is a 3 times image forming type, mirror reflecting type optical system that comprises at least eight reflecting mirrors and that has been made more compact in the radial direction.

In addition, another purpose of the present invention is to provide a projection optical system that has a relatively large image side numerical aperture.

Also, a purpose is to provide an exposure apparatus that ensures high resolving power using, for example, x-ray as the exposure light and that is able to perform projection exposure at high resolution and high throughput by applying the projection optical system of the present invention to an exposure apparatus.

In order to solve the aforementioned problems, provided in the first embodiment of the present invention is a projection optical system that comprises at least eight reflecting mirrors and forms a reduced image of a first surface on a second surface; characterized in that it comprises a first reflecting image forming optical system G1 for forming a first intermediate image of said first surface based on light from said first surface, a second reflecting image forming optical system G2 for forming a second intermediate image of said first surface based on light from said first intermediate image, and a third reflecting image forming optical system G3 for forming said reduced image on said second surface based on light from said second intermediate image, and the number of reflecting mirrors that comprises said third reflecting image forming optical system G3 is higher than the number of reflecting mirrors that comprises said first reflecting image forming optical system G1 and is greater than or equal to the number of reflecting mirrors that comprises said second reflecting image forming optical system G2.

Provided in the second embodiment of the present invention is an exposure apparatus; characterized in that it comprises an illumination system for illuminating a mask that has been set up on said first surface and a projection optical system of the first embodiment for projecting the pattern of said mask onto a photosensitive substrate that has been set up on said second surface.

Provided in the third embodiment of the present invention is a device manufacturing method; characterized in that it includes an exposure process that uses the exposure apparatus of the second embodiment to expose the pattern of said mask onto said photosensitive substrate and a development process that develops said photosensitive substrate that has gone through said exposure process.

In the projection optical system of the present invention, in a 3 times image forming type optical system consisting of at least eight reflecting mirrors, the third reflecting image forming optical system G3 is configured by, for example, four reflecting mirrors M7~M10 so that the number of reflecting mirrors that comprises the third reflecting image forming optical system G3 is higher than the number of reflecting mirrors that comprises the first reflecting image forming optical system G1 and equal to or greater than the number of reflecting mirrors that comprises the second reflecting image forming optical system G2. As a result, in contrast with the prior art, in which the third reflecting image forming optical system is configured by two reflecting mirrors, it is possible to keep the effective radius of the largest reflecting mirror relatively small.

In addition, in the present invention, it is possible to realize a projection optical system that is more compact in the radial direction and that has a relatively large image side numerical aperture. Also, by applying the projection optical system of the present invention to an exposure apparatus, it is possible to use x-ray as the exposure light. In this case, the mask and the photosensitive substrate are moved relative to the projection optical system, and projection exposure of the pattern of the mask onto the photosensitive substrate is performed at high resolution and high throughput. As a result, it is possible to manufacture high precision devices at high throughput under good exposure conditions using a scanning type exposure apparatus that has high resolving power.

DETAILED DESCRIPTION OF THE INVENTION

Figure 1:
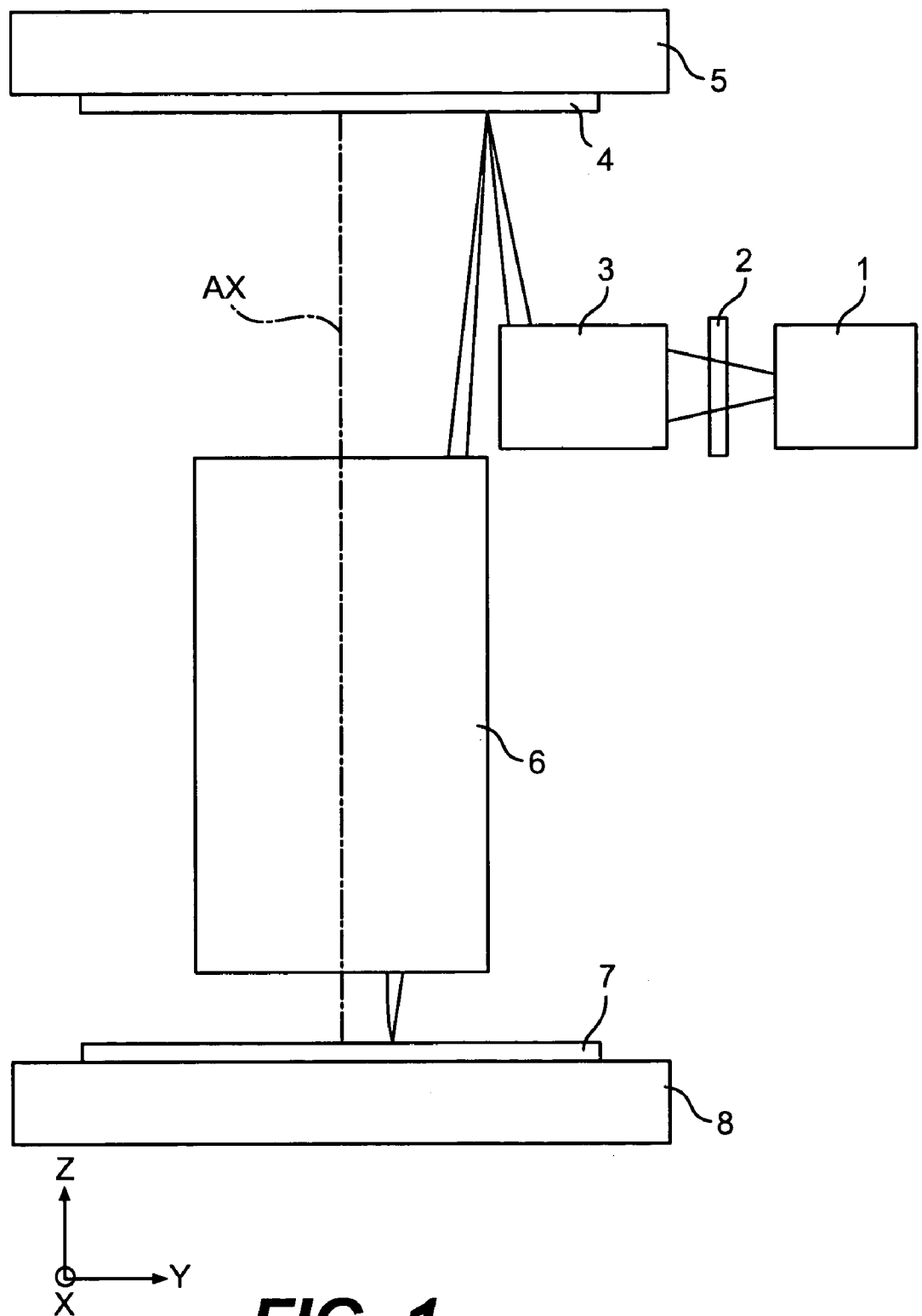
FIG. 1 is a drawing that schematically shows the configuration of an exposure apparatus relating to an embodiment of the present invention.

The first projection optical system comprises, for example, ten reflecting mirrors M1~M10, and light from the first surface (object plane) forms the first intermediate image of the first surface via a first reflecting image forming optical system G1. The light from the first intermediate image formed via the first reflecting image forming optical system G1 forms a second intermediate image (image of the first intermediate image) of the first surface via a second reflecting image forming optical system G2. The light from the second intermediate image formed via the first reflecting image forming optical system G1 forms the final reduced image (image of the second intermediate image) of the first surface on the second surface (image plane) via the third reflecting image forming optical system G3.

Specifically, the first intermediate image of the first surface is formed in the optical path between the first reflecting image forming optical system G1 and the second reflecting image forming optical system G2, and the second intermediate image of the first surface is formed in the optical path between the second reflecting image forming optical system G2 and the third reflecting image forming optical system G3. In the first projection optical system, in, for example, a 10-mirror reflecting type, 3 times image forming type basic configuration such as that discussed above, the number of reflecting mirrors that comprises the third reflecting image forming optical system G3 is higher than the number of reflecting mirrors that comprises the first reflecting image forming optical system G1 and equal to or greater than the number of reflecting mirrors that comprises the second reflecting image forming optical system G2.

Specifically, the third reflecting image forming optical system G3 has four or more reflecting mirrors, for example. In addition, to give a specific example, the first reflecting image forming optical system G1 has two reflecting mirrors, specifically, it has a first reflecting mirror M1 and a second reflecting mirror M2, the second reflecting image forming optical system G2 has four reflecting mirrors, specifically, it has third reflecting mirror M3~sixth reflecting mirror M6, and the third reflecting image forming optical system G3 has four reflecting mirrors, specifically, it has seventh reflecting mirror M7~tenth reflecting mirror M10.

In general, in a 3 times image forming type reflecting optical system, in the case of the prior art in which the third reflecting image forming optical system is comprised by two reflecting mirrors as in U.S. Pat. No. 6,710,917 discussed above, the effective radius of the largest reflecting mirror in the second reflecting image forming optical system (and, in turn, the largest reflecting mirror in the optical system) is determined directly depending on the image side numerical aperture NA of the optical system. In the present example, in a 10-mirror reflecting type, 3 times image forming type optical system, for example, the third reflecting image forming optical system G3 is comprised by, for example, four reflecting mirrors M7~M10 so that the number of reflecting mirrors that comprises the third reflecting image forming optical system G3 is larger than the number of reflecting mirrors that comprises the first reflecting image forming optical system G1 and greater than or equal to the number of reflecting mirrors that comprises the second reflecting image forming optical system G2.

As a result, it is possible to keep the effective radius of the largest reflecting mirror relatively small even if the image side numerical aperture NA of the optical system has been set to be relatively large, without the effective radius of the largest reflecting mirror directly depending on the image side numerical aperture NA. Specifically, it is possible to realize a projection optical system that is more compact in the radial direction and that has a relatively large image side numerical aperture.

Also, in the first projection optical system, by comprising the first reflecting image forming optical system G1 arranged most on the object side of two reflecting mirrors M1 and M2, it is possible to avoid the effective radii of reflecting mirrors M1 and M2 in the first reflecting image forming optical system G1 becoming large. If we suppose that the first reflecting image forming optical system G1 is comprised of four reflecting mirrors, the light rays crowd into the optical path in the first reflecting image forming optical system G1, and it is considerably difficult to design it in such a way that an image forming light ray is not blocked (shaded) by the reflecting mirrors. In addition, the reflecting mirrors themselves mutually approach each other, and it is considerably difficult to ensure the space required at the rear surfaces of the respective reflecting mirrors.

In the first projection optical system, it is preferable that Conditional Expression (1) below be satisfied. In Conditional Expression (1), H0 is the maximum object height of the first surface, and Mϕ is the maximum value of the effective radius of reflecting mirrors M1~M10. Specifically, Mϕ is the radius of a circle circumscribed at said reflecting region with the optical axis as the center in a reflecting mirror (largest reflecting mirror) that has the reflecting region (usage region) most separated from the optical axis.

$$0.5 < M\phi/H0 < 2.5 \qquad (1)$$

When the upper limit value of Conditional Expression (1) is exceeded, it is not preferable, since the effective radius Mϕ of the largest reflecting mirror becomes too large, and the optical system becomes larger in the radial direction. On the other hand, when the lower limit value of Conditional Expression (1) is not reached, it is considerably practically difficult to design, for example, a 10-mirror reflecting type, 3 times image forming type optical system, so it is not preferable. Note that it is preferable that the upper limit value of Conditional Expression (1) be set to 2.0 to better keep the optical system from becoming larger along the radial direction.

In addition, in the first projection optical system, it is preferable that Conditional Expression (2) below be satisfied. In Conditional Expression (2), as described above, H0 is the maximum object height of the first surface, and TT is the axial interval (that is, the object-to-image distance) between the first surface and the second surface.

$$10 < TT/H0 < 15 \qquad (2)$$

When the upper limit value of Conditional Expression (2) is exceeded, it is not preferable, since the axial interval TT, as the total length of the optical system, becomes too large, causing the optical system to become larger in the axial direction (the direction along the optical axis). On the other hand, when the lower limit value of Conditional Expression (2) is not reached, it is not preferable, since it is considerably practically difficult to design, for example, a 10-mirror reflecting type, 3 times image forming type optical system. Note that it is preferable that the upper limit value of Conditional Expression (2) be set to 13 to better keep the optical system from becoming larger along the axial direction.

Also, in the first projection optical system, it is preferable that an aperture stop be provided at the position of the reflecting surface of the fourth reflecting mirror M4 or at a position in the vicinity thereof, or at the position of the reflecting surface of the fifth reflecting mirror M5 or at a position in the vicinity thereof. This configuration is effective in ensuring a large image side numerical aperture NA in, for example, a 10-mirror reflecting type, 3 times image forming type optical system. Through this aperture stop, it is possible to restrict the light ray to the preferred size, so it is possible to perform adjustment of the quantity of light and adjustment of the depth of focus and the depth of field of the second surface (image plane). Also, in the first projection optical system, it is preferable that the numerical aperture NA of the image side (second surface side) be 0.45 or higher to achieve high resolution.

On the other hand, the second projection optical system comprises, for example, eight reflecting mirrors M1~M8, and light from the first surface (object surface) forms the first intermediate image of the first surface via the first reflecting image forming optical system G1. Light from the first intermediate image formed via the first reflecting image forming optical system G1 forms the second intermediate image (image of the first intermediate image) of the first surface via the second reflecting image forming optical system G2. Light from the second intermediate image formed via the first reflecting image forming optical system G1 forms the final reduced image (image of the second intermediate image) of the first surface on the second surface (image plane) via the third reflecting image forming optical system G3.

Specifically, the first intermediate image of the first surface is formed in the optical path between the first reflecting image forming optical system G1 and the second reflecting image forming optical system G2, and the second intermediate image of the first surface is formed in the optical path between the second reflecting image forming optical system G2 and the third reflecting image forming optical system G3. In the second projection optical system, in, for example, an 8-mirror reflecting type, 3 times image forming type basic configuration such as that discussed above, the number of reflecting mirrors that comprises the third reflecting image forming optical system G3 is higher than the number of reflecting mirrors that comprises the first reflecting image forming optical system G1 and larger than the number of reflecting mirrors that comprises the second reflecting image forming optical system G2.

In other words, in the second projection optical system, the number of reflecting mirrors that comprises the third reflecting image forming optical system G3 is the largest. In addition, as a specific example, the first reflecting image forming optical system G1 has two reflecting mirrors, specifically, it has a first reflecting mirror M1 and a second reflecting mirror M2, the second reflecting image forming optical system G2 has two reflecting mirrors, specifically, it has a third reflecting mirror M3 and a fourth reflecting mirror M4, and the third reflecting image forming optical system G3 has four reflecting mirrors, specifically, it has fifth reflecting mirror M5~eighth reflecting mirror M8.

In the second projection optical system, a configuration in which the number of reflecting mirrors that comprises the third reflecting image forming optical system G3 is largest is employed in, for example, an 8-mirror reflecting type, 3 times image forming type basic configuration, so it is possible to set the direction of the light ray that is incident to the third reflecting image forming optical system G3 to a direction in which there is separation from the optical axis. By setting the direction of the light ray that is incident to the third reflecting image forming optical system G3 to an direction in which there is separation from the optical axis, it is possible to avoid the effective diameters of the reflecting mirrors in the second reflecting image forming optical system G2 becoming larger. Specifically, it is possible to realize a projection optical system that is, for example, a 3 times image forming type, 8-mirror reflecting type optical system comprising eight reflecting mirrors and that is more compact in the radial direction.

Also, in the second projection optical system, since the first reflecting image forming optical system G1 and the second reflecting image forming optical system G2 respectively comprise two reflecting mirrors, it is possible to keep the angle of inclination of the chief ray as small as possible, and, in turn, it is possible to avoid the effective diameter of the reflecting mirror that receives the light ray from becoming larger in the second reflecting image forming optical system G2.

In the second projection optical system, it is preferable that Conditional Expression (3) below be satisfied. In Conditional Expression (3), H0 is the maximum object height of the first surface, and Mφ is the maximum value of the effective radii of reflecting mirrors M1~M8. Specifically, Mφ is the radius of a circle circumscribed at said reflecting region with the optical axis as the center in a reflecting mirror (largest reflecting mirror) that has the reflecting region (usage region) most separated from the optical axis.

$$0.7 < M\phi/H0 < 2.5 \tag{3}$$

When the upper limit value of Conditional Expression (3) is exceeded, it is not preferable since the effective radius Mφ of the largest reflecting mirror becomes too large, causing the optical system to become larger in the radial direction. On the other hand, when the lower limit value of Conditional Expression (3) is not reached, it is considerably practically difficult to design, for example, an 8-mirror reflecting type, 3 times image forming type optical system, so it is not preferable. Specifically, in the second projection optical system, by satisfying Conditional Expression (3), it is possible to keep the effective radius Mφ of the largest reflecting mirror small, and, in turn, it is possible to prevent the projection optical system from becoming larger in the radial direction.

In addition, in the second projection optical system, it is preferable that the effective radius Mφ of the largest reflecting mirror satisfy Conditional Expression (4). By satisfying Conditional Expression (4), it is possible to keep the effective radius Mφ of the largest reflecting mirror small, and, in turn, it is possible to prevent the projection optical system from becoming larger in the radial direction.

$$200 \text{ mm} < M\phi < 350 \text{ mm} \tag{4}$$

Also, in the second projection optical system, it is preferable that Conditional Expression (5) below be satisfied. In Conditional Expression (5), d4 is the distance from the fourth reflecting mirror M4 to the fifth reflecting mirror M5 along the optical axis, and d5 is the distance from the fifth reflecting mirror M5 to the sixth reflecting mirror M6 along the optical axis.

$$0.05 < d5/d4 < 0.5 \tag{5}$$

When the lower limit value of Conditional Expression (5) is not reached, it is not preferable, because the sixth reflecting mirror M6 comes too close to the fifth reflecting mirror M5, making it difficult to adequately ensure the width of the light ray. On the other hand, when the upper limit value of Conditional Expression (5) is exceeded, it is not preferable because the third reflecting mirror M3 and the eighth reflecting mirror M8, which are positioned between the fourth reflecting mirror M4 and the sixth reflecting mirror M6, come too close to each other, and the third reflecting mirror M3 and the eighth reflecting mirror M8 come too close to the fourth reflecting mirror M4 and the sixth reflecting mirror M6, making it difficult to adequately ensure space for the cooling apparatuses, etc. to be arranged on the rear surface sides of the respective reflecting mirrors.

In addition, in the second projection optical system, it is preferable that Conditional Expression (6) below be satisfied. In Conditional Expression (6), d4 is the distance from the fourth reflecting mirror M4 to the fifth reflecting mirror M5 along the optical axis, and d6 is the distance from the sixth reflecting mirror M6 to the seventh reflecting mirror M7 along the optical axis.

$$0.1 < d6/d4 < 1.0 \tag{6}$$

When the lower limit value of Conditional Expression (6) is not reached, it is not preferable, because the angle of the incident ray going to the seventh reflecting mirror M7 becomes too large, which tends to become a cause of deterioration and nonuniformity of the reflection characteristics of the seventh reflecting mirror M7. On the other hand, when the upper limit value of Conditional Expression (6) is exceeded, it is not preferable, because the third reflecting mirror M3 and the eighth reflecting mirror M8, which are positioned between the fourth reflecting mirror M4 and the sixth reflecting mirror M6, come too close to each other, and the third reflecting mirror M3 and the eighth reflecting mirror M8 come too close to the fourth reflecting mirror M4 and the sixth reflecting mirror M6, making it difficult to adequately ensure space for the cooling apparatuses, etc. to be arranged on the rear surface sides of the respective reflecting mirrors.

In addition, in the second projection optical system, it is preferable that an aperture stop be provided at the position of the reflecting surface of the fourth reflecting mirror M4. This configuration is effective in ensuring a large image side numerical aperture NA in, for example, an 8-mirror reflecting type, 3 times image forming type optical system. Through this aperture stop, it is possible to restrict the light ray to the preferred size, so it is possible to perform adjustment of the quantity of light and adjustment of the depth of focus and the depth of field of the second surface (image plane). Also, in the second projection optical system, it is preferable that the numerical aperture NA of the image side (second surface side) be 0.3 or higher to achieve high resolution, and it is even more preferable that the image side numerical aperture NA be 0.4 or higher.

In the second reflecting type projection optical system, to satisfy the above respective Conditional Expressions (3)~(6), the number of reflecting mirrors used from the first surface (object plane) to the second intermediate image (that is, the reflecting mirrors in the first reflecting image forming optical system G1 and the reflecting mirrors in the second reflecting image forming optical system G2) in the configuration is four, and the number of reflecting mirrors used from the second intermediate image to the second surface (image plane) (that is, the reflecting mirrors in the third reflecting image forming optical system G3) in the configuration is four. In the case where this configuration is not satisfied, it becomes difficult to satisfy all of the aforementioned respective Conditional Expressions (3)~(6), and various drawbacks, for example, the drawback whereby the effective radius of the reflecting mirror becomes large, the drawback whereby the angle of incidence of the light ray going to the reflecting mirror becomes large, and the drawback whereby the intervals of the respective reflecting mirrors become narrow tend to occur.

Note that it is preferable that the projection optical system of the present invention be an optical system that is nearly telecentric on the image side (second surface side). Through this configuration, for example, in the case of application to an exposure apparatus, good image formation is possible even if there is unevenness in the wafer within the depth of focus of the projection optical system.

In addition, in the projection optical system of the present invention, it is desirable that the first reflecting image forming optical system G1 include at least one concave reflecting mirror. Through this configuration, it is possible to form the first intermediate image by converging the divergent light ray from the object of the first surface (object plane). If we suppose that a concave reflecting mirror is not included in the first image forming optical system G1, it is not possible to converge the divergent light ray from the first surface, the first intermediate image becomes a virtual image, and its formation position also becomes considerably separated from the optical system. In that case, a status in which the width of the light ray has expanded when the light ray from the first intermediate virtual image passes the edge of the first reflecting mirror M1 results, so the optical system as a whole becomes larger.

Also, in the projection optical system of the present invention, it is desirable that the second reflecting image forming optical system G2 include at least one concave reflecting mirror. Through this configuration, it is possible to cause the second intermediate image to be formed by converging the divergent light ray from the first intermediate image formed by the first reflecting image forming optical system G1. If we suppose that a concave reflecting mirror is not included in the second image forming optical system G2, it is not possible to converge the divergent light ray from the first intermediate image, the second intermediate image becomes a virtual image, and its formation position also becomes considerably separated from the optical system. In that case, in the first projection optical system, a status in which the width of the light ray has expanded when the light ray from the first intermediate image, as a virtual image, passes the edge of the fifth reflecting mirror M5 results, so the optical system as a whole becomes larger. In the second projection optical system, a status in which the width of the light ray has expanded when the light ray from the first intermediate image, as a virtual image, passes the edge of the third reflecting mirror M3 results, so the optical system as a whole becomes larger.

In addition, in the projection optical system of the present invention, it is desirable that the third reflecting image forming optical system G3 include at least one concave reflecting mirror. Through this configuration, it is possible to converge the divergent light ray from the second intermediate image formed by the second reflecting image forming optical system G2 and to form the final image on the second surface (image plane). If we suppose that a concave reflecting mirror is not included in the third image forming optical system G3, it is not possible to converge the divergent light ray from the second intermediate image, the final image becomes a virtual image, and it is not possible to form the image of the first surface on the second surface. In the above way, by configuring in such a way that the image formation positions of the respective intermediate images come to the vicinity of the large reflecting mirror, passing of the edge of the large reflecting mirror is caused in a status in which the width of the light ray has become narrower, and the optical system is prevented from becoming larger.

In addition, in the projection optical system of the present invention, it is preferable that all of the reflecting mirrors have reflecting surfaces formed in an aspheric surface shape. By introducing an aspheric surface shape in this way, it is possible to correct aberration well to improve optical performance. Note that it is preferable that the reflecting surfaces of the respective reflecting mirrors be formed into an aspheric surface shape that is rotationally symmetrical with respect to the optical axis and that the maximum order of the aspheric surfaces that define the respective reflecting surfaces be the tenth order or higher.

By applying the projection optical system of the present invention to an exposure apparatus, it is possible to use x-rays as the exposure light. In this case, the mask and the photosensitive substrate are moved relatively with respect to the projection optical system to perform projection exposure of the pattern of the mask onto the photosensitive substrate at high resolution and at high throughput. As a result, it is possible to use a scanning type exposure apparatus that has high resolving power to manufacture high precision devices at high throughput under good exposure conditions.

Figure 2:
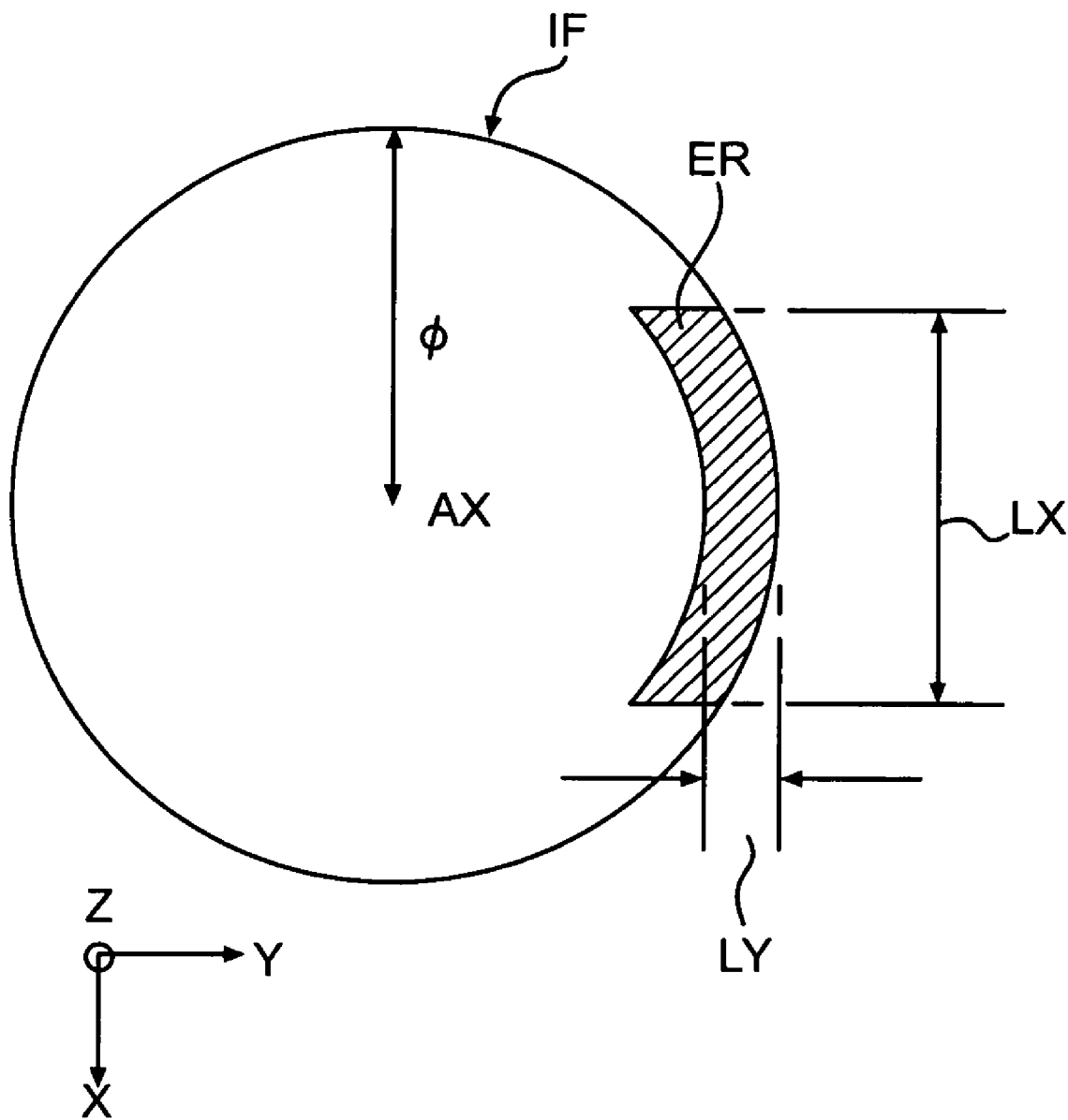
FIG. 2 is a drawing that shows the positional relationship between the optical axis and the arc-shaped effective image forming region formed on the wafer.

An embodiment of the present invention will be explained based on the attached drawings. FIG. 1 is a drawing that schematically shows the configuration of an exposure apparatus relating to an embodiment of the present invention. Also, FIG. 2 is a drawing that shows the positional relationship between the optical axis and the arc-shaped effective image forming region formed on the wafer. In FIG. 1, the Z axis is set up in the optical axis direction of the projection optical system, that is, along the direction of the normal line of the wafer, which is the photosensitive substrate, the Y axis is set up in a direction parallel to the page surface of FIG. 1 within the wafer plane, and the X axis is set up in a direction perpendicular to the page surface of FIG. 1 within the wafer plane.

The exposure apparatus of FIG. 1 comprises, for example, a laser plasma x-ray source 1 as the light source for supplying exposure light. The light that has exited from the x-ray source 1 is incident to the illumination optical system 3 via a wavelength selection filter 2. Here, the wavelength selection filter 2 has characteristics such that it selectively allows only x-rays of a prescribed wavelength (13.5 nm) to pass from the light supplied by the x-ray source 1, and it blocks the passage of light of other wavelengths. The x-rays that have passed through the wavelength selection filter 2 illuminate a reflecting type mask 4 on which the pattern to be transferred has been formed via an illumination optical system 3 configured by a plurality of reflecting mirrors.

The mask 4 is held by mask stage 5 that is able to move along the Y direction so that the pattern surface extends along the XY plane. In addition, the configuration is such that the movement of the mask stage 5 is measured by a laser interferometer that is not shown in the drawing. An arc-shaped illumination region that is symmetrical with respect to the Y axis is formed on the mask 4. The light from the illuminated mask 4 forms the mask pattern image on the wafer 7, which is the photosensitive substrate, via a reflecting type projection optical system 6.

Specifically, as shown in FIG. 2, an arc-shaped effective image forming region that is symmetrical with respect to the Y axis is formed on the wafer 7. As shown in FIG. 2, within a circular region (image circle) IF having a radius φ with the optical axis AX as the center, an arc-shaped effective image forming region ER is set up, in which the length in the X direction is LX and the length in the Y direction is LY so as to come into contact with this image circle IF. In this way, the arc-shaped effective image forming region ER is a portion of a ring shaped region having optical axis AX as its center, and the length LY is the width dimension of the effective image forming region ER along a direction that links the optical axis with the center of the arc-shaped effective image forming region ER.

The wafer 7 is held by a wafer stage 8 that is able to move two-dimensionally along the X direction and the Y direction so that the exposure surface thereof extends along the XY plane. Note that it is configured in such a way that movement of the wafer stage 8 is measured by a laser interferometer that is not shown in the drawing in the same way as the mask stage 5. In this way, the pattern of the mask 4 is transferred onto one exposure region of the wafer 7 by performing scan exposure while moving the mask stage 5 and the wafer stage 8 along the Y direction, that is, while relatively moving the mask 4 and the wafer 7 along the Y direction in relation to the projection optical system 6.

At this time, if the projection magnification (transfer magnification) of the projection optical system 6 is ¼, the velocity of movement of the wafer stage 8 is set to ¼ the velocity of movement of the mask stage 5 to perform synchronous scanning. In addition, by repeating scanning exposure while two dimensionally moving the wafer stage 8 along the X direction and the Y direction, the pattern of the mask 4 is sequentially transferred to the respective exposure regions of the wafer 7. The specific configuration of the first projection optical system will be explained below while referring to the first working example and the second working example. In addition, the specific configuration of the second projection optical system will be explained while referring to the third working example~fifth working example.

In the respective working examples, the projection optical system 6 comprises a first reflecting image forming optical system G1, which is for forming the first intermediate image of the pattern of the mask 4, a second reflecting image forming optical system G2, which is for forming the second intermediate image (image of the first intermediate image) of the pattern of the mask 4, and a third reflecting image forming optical system G3, which is for forming the final reduced image (image of the second intermediate image) of the pattern of the mask 4 on the wafer 7. Specifically, the first intermediate image of the mask pattern is formed in the optical path between the first reflecting image forming optical system G1 and the second reflecting image forming optical system G2, and the second intermediate image of the mask pattern is formed in the optical path between the second reflecting image forming optical system G2 and the third reflecting image forming optical system G3.

Specifically, in the first working example and the second working example, the first reflecting image forming optical system G1 comprises two reflecting mirrors, M1 and M2, the second reflecting image forming optical system G2 comprises four reflecting mirrors, M3~M6, and the third reflecting image forming optical system G3 comprises four reflecting mirrors, M7~M10. In addition, the reflecting surfaces of all of reflecting mirrors M1~M10 are formed in an aspheric shape that is rotationally symmetrical with respect to the optical axis.

On the other hand, in the third working example~fifth working example, the first reflecting image forming optical system G1 comprises two reflecting mirrors, M1 and M2, the second reflecting image forming optical system G2 comprises two reflecting mirrors, M3 and M4, and the third reflecting image forming optical system G3 comprises four reflecting mirrors, M5~M8. In addition, the reflecting surfaces of all of reflecting mirrors M1~M8 are formed in an aspheric shape that is rotationally symmetrical with respect to the optical axis.

Note that in the respective working examples, although there are cases in which an intermediate image that is absolutely clear is not formed, for example, even if it is an unclear intermediate image (for example, the second intermediate image I2 of the first working example), the formation position thereof is defined as the best intermediate image formation position. In addition, in the respective working examples, the projection optical system 6 is an optical system that is nearly telecentric on the wafer side (image side).

In the respective working examples, the aspheric surface is expressed by the following equation (a) when y denotes the height in a direction perpendicular to the optical axis, z denotes the distance (amount of sag) along the optical axis from the tangential plane at the vertex of the aspheric surface to a position on the aspheric surface at height y, r denotes the vertex radius of curvature, κ denotes the conic coefficient, and $C_n$ denotes the $n^{th}$ degree aspheric surface coefficient.

$$z=(y^2/r)/\{1+\{1-(1+\kappa)\cdot y^2/r^2\}^{1/2}\}+C_4\cdot y^4+C_6\cdot y^6+C_8\cdot y^8+C_{10}\cdot y^{10}+ \qquad (a)$$

FIRST WORKING EXAMPLE

Figure 3:
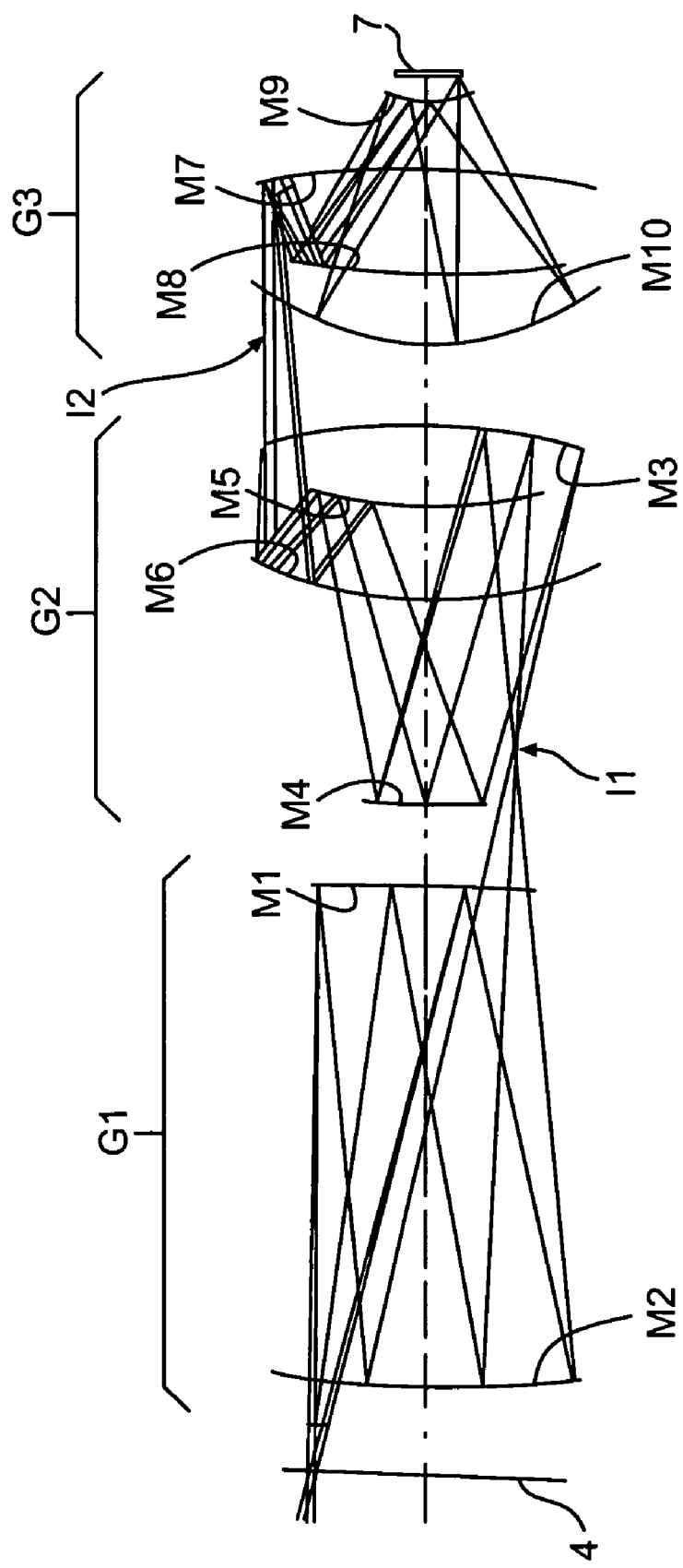
FIG. 3 is a drawing that shows the configuration of a projection optical system relating to the first working example of the present embodiment.

FIG. 3 is a drawing that shows the configuration of a projection optical system relating to the first working example of the present embodiment. Referring to FIG. 3, in the projection optical system of the first working example, the light from the mask 4 forms the first intermediate image I1 of the mask pattern after being sequentially reflected by the concave reflecting surface of the first reflecting mirror M1 and the concave reflecting surface of the second reflecting mirror M2. The light from the first intermediate image I1 formed via the first reflecting image forming optical system G1 forms the second intermediate image I2 of the mask pattern after being sequentially reflected by the concave reflecting surface of the third reflecting mirror M3, the concave reflecting surface of the fourth reflecting mirror M4, the convex reflecting surface of the fifth reflecting mirror M5, and the concave reflecting surface of the sixth reflecting mirror M6.

The light from the second intermediate image I2 formed via the second reflecting image forming optical system G2 forms a reduced image (tertiary image) of the mask pattern on the wafer 7 after being sequentially reflected by the concave reflecting surface of the seventh reflecting mirror M7, the concave reflecting surface of the eighth reflecting mirror M8, the convex reflecting surface of the ninth reflecting mirror M9, and the concave reflecting surface of the tenth reflecting mirror M10. In the first working example, an aperture stop (not shown in the drawing) is provided at a position in the vicinity of the reflecting surface of the fourth reflecting mirror M4.

Table (1) below presents the values of the specifications of the projection optical system relating to the first working example. In the main specifications column of Table (1), λ denotes the wavelength of the exposure light, β denotes the projection magnification, NA denotes the image side (wafer side) numerical aperture, φ denotes the radius (maximum image height) of the image circle IF on the wafer 7, LX denotes the dimensions of the effective image forming region ER along the X direction, and LY denotes the dimensions of the effective image forming region ER along the Y direction. In addition, in the conditional expression corresponding values column of Table (1), H0 denotes the maximum object height on the mask 4, Mφ denotes the effective radius of the largest reflecting mirror, and TT denotes the axial interval between the mask 4 and the wafer 7.

In addition, the surface number denotes the sequence of reflecting surfaces from the mask side along the direction in which the light ray progresses from the mask surface, which is the object surface, to the wafer surface, which is the image surface, r denotes the vertex radii of curvature (mm) of the respective reflecting surfaces, and d denotes the axial intervals (mm), that is, the surface intervals (mm), of the respective reflecting surfaces. Note that the sign of the surface interval d is changed each time it is reflected. In addition, regardless of the direction of incidence of the light ray, facing the mask side, the radius of curvature of the convex surface is considered to be positive, and the radius of curvature of the concave surface is considered to be negative. The aforementioned notation is also the same in Table (2) below and thereafter.

TABLE (1)

(Main Specifications)

$\lambda = 13.5$ nm
$\beta = \frac{1}{4}$
NA = 0.50
$\phi = 43$ mm
LX = 26 mm
LY = 2 mm (Optical Member Specifications)

| Surface Number | r | d | Optical Member |
|---|---|---|---|
|  | (Mask surface) | 871.9 |  |
| 1 | −2597.7 | −751.9 | (First reflecting mirror M1) |
| 2 | 1369.4 | 1436.6 | (Second reflecting mirror M2) |
| 3 | −954.2 | −564.7 | (Third reflecting mirror M3) |
| 4 | 1719.7 | 443.3 | (Fourth reflecting mirror M4) |
| 5 | 487.0 | −139.1 | (Fifth reflecting mirror M5) |
| 6 | 573.9 | 639.0 | (Sixth reflecting mirror M6) |
| 7 | −1525.7 | −150.0 | (Seventh reflecting mirror M7) |
| 8 | 1296.0 | 250.0 | (Eighth reflecting mirror M8) |
| 9 | 160.5 | −352.6 | (Ninth reflecting mirror M9) |
| 10 | 414.9 | 392.6 | (Tenth reflecting mirror M10) |
|  | (Wafer surface) |  |  |

(Aspheric Surface Data)

First surface $\kappa = 0.000000$
$C_4 = 0.116001 \times 10^{-8}$        $C_6 = 0.240996 \times 10^{-14}$
$C_8 = 0.106659 \times 10^{-19}$       $C_{10} = -0.457864 \times 10^{-24}$
$C_{12} = -0.154517 \times 10^{-28}$   $C_{14} = 0.331050 \times 10^{-34}$
$C_{16} = -0.232288 \times 10^{-39}$ Second surface $\kappa = 0.000000$
$C_4 = -0.195136 \times 10^{-9}$       $C_6 = 0.312496 \times 10^{-15}$
$C_8 = 0.191526 \times 10^{-20}$       $C_{10} = 0.356571 \times 10^{-26}$
$C_{12} = 0.201978 \times 10^{-30}$    $C_{14} = -0.273473 \times 10^{-35}$
$C_{16} = 0.139857 \times 10^{-40}$ Third surface $\kappa = 0.000000$
$C_4 = 0.113499 \times 10^{-9}$        $C_6 = -0.267770 \times 10^{-14}$
$C_8 = 0.307287 \times 10^{-19}$       $C_{10} = -0.263486 \times 10^{-24}$
$C_{12} = 0.322718 \times 10^{-29}$    $C_{14} = -0.282489 \times 10^{-34}$
$C_{16} = 0.102818 \times 10^{-39}$ Fourth surface $\kappa = 0.000000$
$C_4 = -0.739871 \times 10^{-9}$       $C_6 = -0.219194 \times 10^{-13}$
$C_8 = -0.210581 \times 10^{-17}$      $C_{10} = 0.394058 \times 10^{-22}$
$C_{12} = -0.136815 \times 10^{-25}$   $C_{14} = 0.916312 \times 10^{-30}$
$C_{16} = -0.373612 \times 10^{-34}$

TABLE (1)-continued

Fifth surface $\kappa = 0.000000$
$C_4 = -0.683812 \times 10^{-8}$       $C_6 = -0.826523 \times 10^{-14}$
$C_8 = 0.124502 \times 10^{-17}$       $C_{10} = -0.569937 \times 10^{-22}$
$C_{12} = 0.155970 \times 10^{-26}$    $C_{14} = -0.229023 \times 10^{-31}$
$C_{16} = 0.141107 \times 10^{-36}$ Sixth surface $\kappa = 0.000000$
$C_4 = -0.608142 \times 10^{-9}$       $C_6 = -0.197226 \times 10^{-13}$
$C_8 = 0.312227 \times 10^{-18}$       $C_{10} = -0.455408 \times 10^{-23}$
$C_{12} = 0.363955 \times 10^{-28}$    $C_{14} = -0.169409 \times 10^{-33}$
$C_{16} = 0.342780 \times 10^{-39}$ Seventh surface $\kappa = 0.000000$
$C_4 = 0.340247 \times 10^{-9}$        $C_6 = 0.281829 \times 10^{-14}$
$C_8 = -0.101932 \times 10^{-17}$      $C_{10} = 0.269773 \times 10^{-22}$
$C_{12} = -0.351690 \times 10^{-27}$   $C_{14} = 0.235824 \times 10^{-32}$
$C_{16} = -0.651102 \times 10^{-38}$ Eighth surface $\kappa = 0.000000$
$C_4 = 0.112544 \times 10^{-8}$        $C_6 = -0.988047 \times 10^{-13}$
$C_8 = 0.228419 \times 10^{-17}$       $C_{10} = -0.348634 \times 10^{-22}$
$C_{12} = 0.279593 \times 10^{-27}$    $C_{14} = -0.661230 \times 10^{-33}$
$C_{16} = -0.281001 \times 10^{-38}$ Ninth surface $\kappa = 0.000000$
$C_4 = 0.365602 \times 10^{-8}$        $C_6 = 0.782229 \times 10^{-12}$
$C_8 = -0.151237 \times 10^{-15}$      $C_{10} = -0.137067 \times 10^{-20}$
$C_{12} = -0.568041 \times 10^{-23}$   $C_{14} = 0.732647 \times 10^{-27}$
$C_{16} = -0.521007 \times 10^{-31}$ Tenth surface $\kappa = 0.000000$
$C_4 = 0.204229 \times 10^{-9}$        $C_6 = 0.121726 \times 10^{-14}$
$C_8 = 0.720901 \times 10^{-20}$       $C_{10} = 0.267646 \times 10^{-25}$
$C_{12} = 0.501662 \times 10^{-30}$    $C_{14} = -0.328350 \times 10^{-35}$
$C_{16} = 0.422058 \times 10^{-40}$ (Conditional Expression Corresponding Values)

H0 = 172 mm
M$\phi$ = 256.5 mm (Largest at the sixth reflecting mirror M6)
TT = 2075.12 mm
(1) M$\phi$/H0 = 1.49
(2) TT/H0 = 12.06

Figure 4:
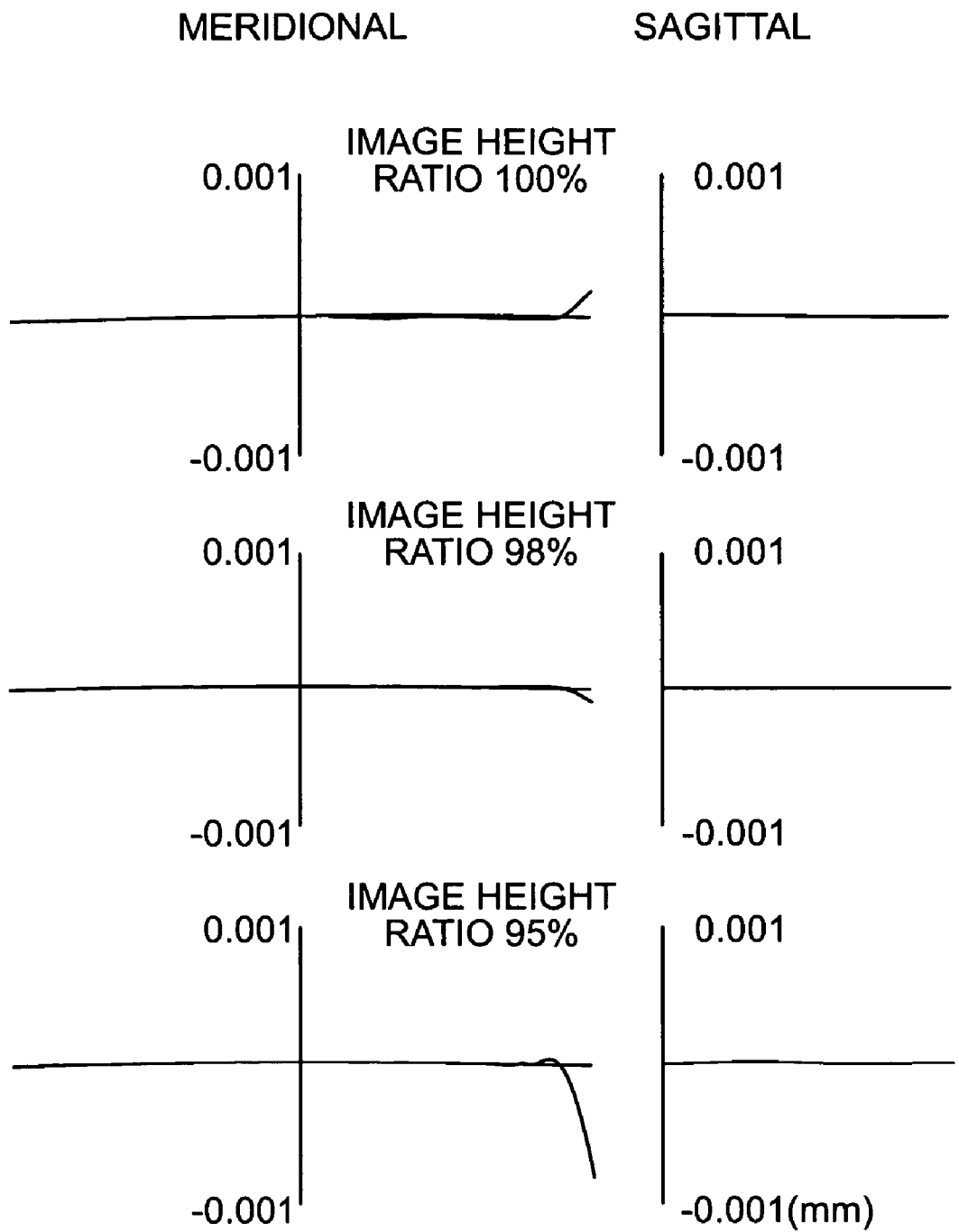
FIG. 4 is a drawing that shows coma aberration in the projection optical system of the first working example.

FIG. 4 is a drawing that shows coma aberration in the projection optical system of the first working example. FIG. 4 shows the meridional coma aberration and the sagittal coma aberration at image height ratio 100%, image height ratio 98% and image height ratio 95%. As is clear from the aberration diagram, in the first working example, it is understood that coma aberration is corrected well in the region that corresponds to the effective image forming region ER. In addition, though a drawing has been omitted, it has been confirmed that various aberrations other than coma aberration, such as spherical aberration and distortion, are also corrected well in the region that corresponds to the effective image forming region ER.

SECOND WORKING EXAMPLE

Figure 5:
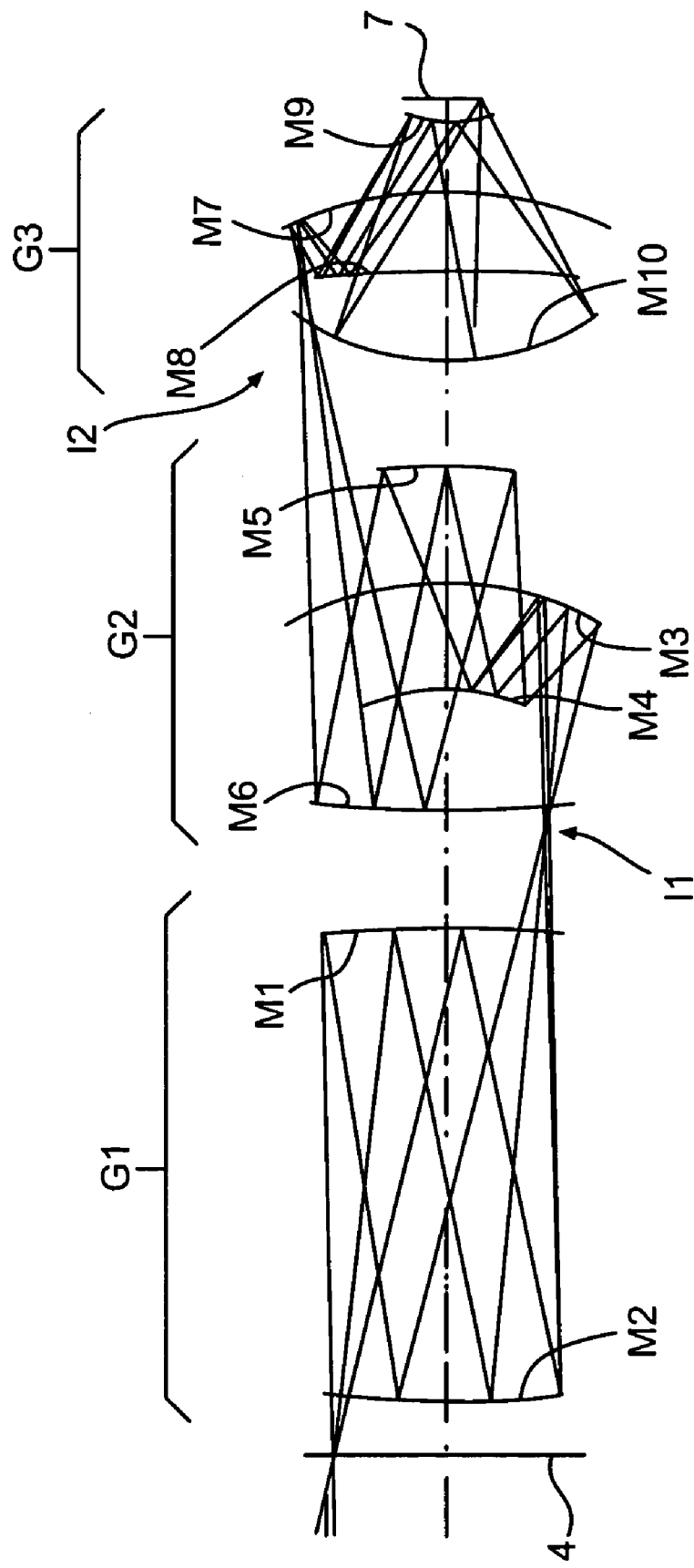
FIG. 5 is a drawing that shows the configuration of a projection optical system relating to the second working example of the present embodiment.

FIG. 5 is a drawing that shows the configuration of a projection optical system relating to the second working example of the present embodiment. Referring to FIG. 5, in the projection optical system of the second working example, the light from the mask 4 forms the first intermediate image I1 of the mask pattern after being sequentially reflected by the concave reflecting surface of the first reflecting mirror M1 and the concave reflecting surface of the second reflecting mirror M2. The light from the first intermediate image I1 formed via the first reflecting image forming optical system G1 forms the second intermediate image I2 of the mask pattern after being sequentially reflected by the concave reflecting surface of the third reflecting mirror M3, the convex reflecting surface of the fourth reflecting mirror M4, the concave reflecting surface of the fifth reflecting mirror M5, and the concave reflecting surface of the sixth reflecting mirror M6.

The light from the second intermediate image I2 formed via the second reflecting image forming optical system G2 forms a reduced image (tertiary image) of the mask pattern on the wafer 7 after being sequentially reflected by the concave reflecting surface of the seventh reflecting mirror M7, the convex reflecting surface of the eighth reflecting mirror M8, the convex reflecting surface of the ninth reflecting mirror M9, and the concave reflecting surface of the tenth reflecting mirror M10. In the second working example, an aperture stop (not shown in the drawing) is provided at a position in the vicinity of the reflecting surface of the fifth reflecting mirror M5. Table (2) below presents the values of the specifications of the projection optical system relating to the second working example.

TABLE (2)

(Main Specifications)

$\lambda$ = 13.5 nm
$\beta$ = ¼
NA = 0.50
$\phi$ = 53 mm
LX = 26 mm
LY = 2 mm (Optical Member Specifications)

| Surface Number | r | d | Optical Member |
|---|---|---|---|
|  | (Mask surface) | 1015.3 |  |
| 1 | −2168.8 | −915.3 | (First reflecting mirror M1) |
| 2 | 1685.3 | 1573.7 | (Second reflecting mirror M2) |
| 3 | −576.8 | −200.5 | (Third reflecting mirror M3) |
| 4 | −349.8 | 429.8 | (Fourth reflecting mirror M4) |
| 5 | −1300.3 | 664.3 | (Fifth reflecting mirror M5) |
| 6 | 3219.6 | 1184.3 | (Sixth reflecting mirror M6) |
| 7 | −628.0 | −150.0 | (Seventh reflecting mirror M7) |
| 8 | −1230.3 | 282.4 | (Eighth reflecting mirror M8) |
| 9 | 260.1 | 452.4 | (Ninth reflecting mirror M9) |
| 10 | 528.5 | 497.0 | (Tenth reflecting mirror M10) |
|  | (Wafer surface) |  |  |

(Aspheric Surface Data)

First surface $\kappa$ = 0.000000
$C_4$ = 0.508128 × 10$^{-9}$        $C_6$ = 0.137308 × 10$^{-14}$
$C_8$ = −0.779297 × 10$^{-20}$      $C_{10}$ = −0.180403 × 10$^{-24}$
$C_{12}$ = 0.511420 × 10$^{-29}$    $C_{14}$ = −0.816526 × 10$^{-34}$
$C_{16}$ = 0.461004 × 10$^{-39}$ Second surface $\kappa$ = 0.000000
$C_4$ = −0.264512 × 10$^{-9}$       $C_6$ = −0.845668 × 10$^{-15}$ TABLE (2)-continued $C_8$ = −0.687232 × 10$^{-20}$      $C_{10}$ = −0.946709 × 10$^{-26}$
$C_{12}$ = −0.127970 × 10$^{-30}$   $C_{14}$ = 0.468930 × 10$^{-35}$
$C_{16}$ = −0.289182 × 10$^{-40}$ Third surface $\kappa$ = 0.000000
$C_4$ = 0.364091 × 10$^{-9}$        $C_6$ = −0.115365 × 10$^{-14}$
$C_8$ = 0.594384 × 10$^{-19}$       $C_{10}$ = −0.978649 × 10$^{-24}$
$C_{12}$ = 0.104000 × 10$^{-28}$    $C_{14}$ = −0.631265 × 10$^{-34}$
$C_{16}$ = 0.174791 × 10$^{-39}$ Fourth surface $\kappa$ = 0.000000
$C_4$ = 0.844011 × 10$^{-8}$        $C_6$ = 0.296619 × 10$^{-13}$
$C_8$ = −0.992554 × 10$^{-18}$      $C_{10}$ = 0.346066 × 10$^{-22}$
$C_{12}$ = −0.904695 × 10$^{-27}$   $C_{14}$ = 0.201765 × 10$^{-31}$
$C_{16}$ = −0.213067 × 10$^{-36}$ Fifth surface $\kappa$ = 0.000000
$C_4$ = 0.993708 × 10$^{-10}$       $C_6$ = −0.690271 × 10$^{-14}$
$C_8$ = −0.104237 × 10$^{-18}$      $C_{10}$ = 0.101592 × 10$^{-23}$
$C_{12}$ = −0.112016 × 10$^{-27}$   $C_{14}$ = 0.402209 × 10$^{-32}$
$C_{16}$ = −0.564544 × 10$^{-37}$ Sixth surface $\kappa$ = 0.000000
$C_4$ = −0.147278 × 10$^{-9}$       $C_6$ = 0.289847 × 10$^{-14}$
$C_8$ = −0.117536 × 10$^{-19}$      $C_{10}$ = 0.904016 × 10$^{-25}$
$C_{12}$ = −0.126090 × 10$^{-29}$   $C_{14}$ = 0.8917778 × 10$^{-35}$
$C_{16}$ = −0.246391 × 10$^{-40}$ Seventh surface $\kappa$ = 0.000000
$C_4$ = 0.239911 × 10$^{-8}$        $C_6$ = −0.106622 × 10$^{-13}$
$C_8$ = −0.102213 × 10$^{-17}$      $C_{10}$ = 0.293508 × 10$^{-22}$
$C_{12}$ = −0.338392 × 10$^{-27}$   $C_{14}$ = 0.186988 × 10$^{-32}$
$C_{16}$ = −0.408415 × 10$^{-38}$ Eighth surface $\kappa$ = 0.000000
$C_4$ = 0.509178 × 10$^{-8}$        $C_6$ = −0.802605 × 10$^{-13}$
$C_8$ = 0.203590 × 10$^{-17}$       $C_{10}$ = −0.365572 × 10$^{-22}$
$C_{12}$ = 0.398740 × 10$^{-27}$    $C_{14}$ = −0.235851 × 10$^{-32}$
$C_{16}$ = 0.578475 × 10$^{-38}$ Ninth surface $\kappa$ = 0.000000
$C_4$ = 0.292014 × 10$^{-7}$        $C_6$ = 0.100877 × 10$^{-11}$
$C_8$ = 0.550615 × 10$^{-16}$       $C_{10}$ = 0.558854 × 10$^{-21}$
$C_{12}$ = 0.113236 × 10$^{-23}$    $C_{14}$ = −0.164271 × 10$^{-27}$
$C_{16}$ = 0.156404 × 10$^{-31}$ Tenth surface $\kappa$ = 0.000000
$C_4$ = 0.992296 × 10$^{-10}$       $C_6$ = 0.286731 × 10$^{-15}$
$C_8$ = 0.106136 × 10$^{-20}$       $C_{10}$ = 0.263325 × 10$^{-26}$
$C_{12}$ = 0.337439 × 10$^{-31}$    $C_{14}$ = −0.137211 × 10$^{-36}$
$C_{16}$ = 0.952444 × 10$^{-42}$ (Conditional Expression Corresponding Values)

H0 = 212 mm
M$\phi$ = 308.4 mm (Largest at the seventh reflecting mirror M7)
TT = 2600.00 mm
(1) M$\phi$/H0 = 1.45
(2) TT/H0 = 12.26

Figure 6:
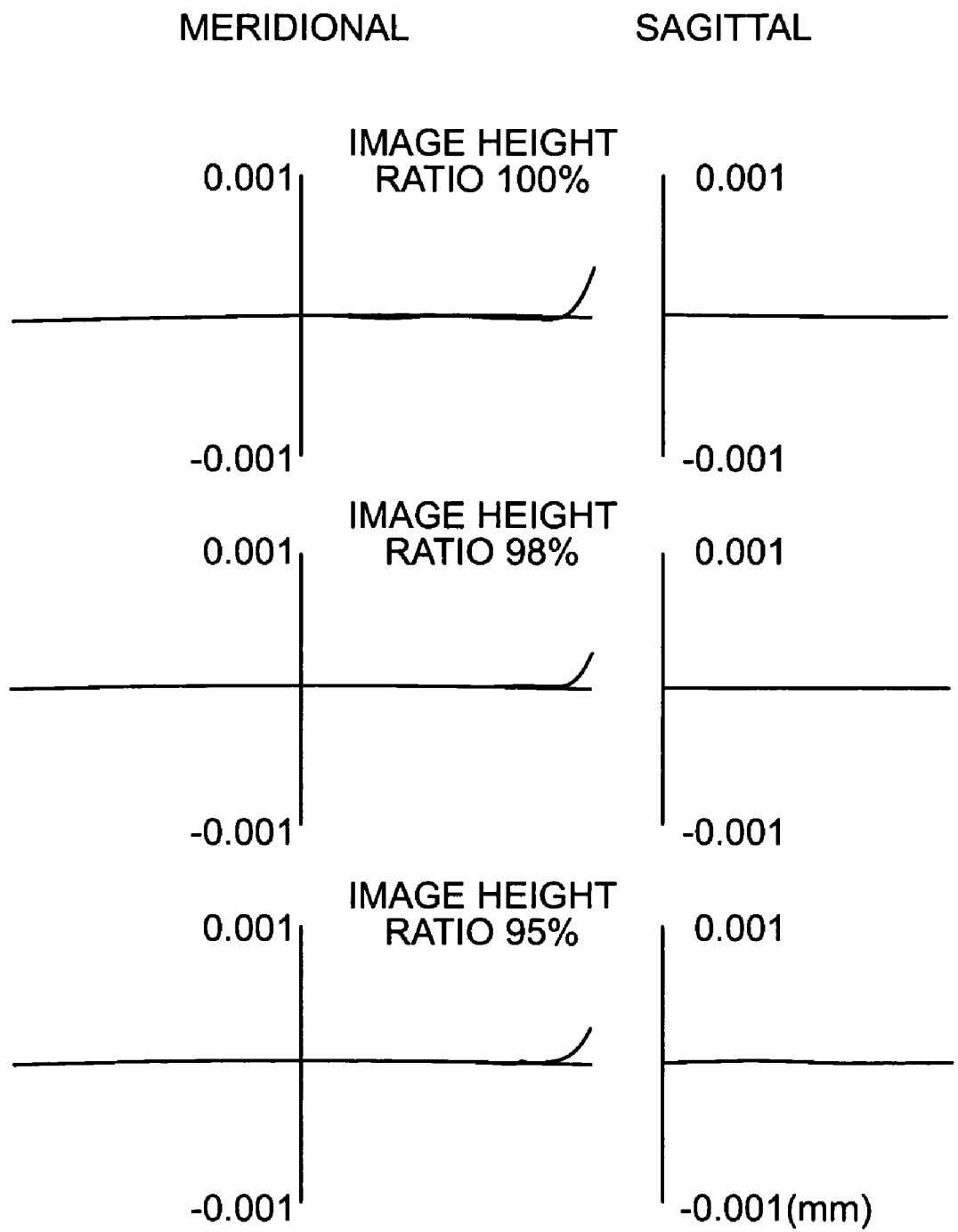
FIG. 6 is a drawing that shows coma aberration in the projection optical system of the second working example.

FIG. 6 is a drawing that shows coma aberration in the projection optical system of the second working example. FIG. 6 shows the meridional coma aberration and the sagittal coma aberration at image height ratio 100%, image height ratio 98% and image height ratio 96%. As is clear from the aberration diagram, it is understood that, in the second working example as well, coma aberration is corrected well in the region that corresponds to the effective image forming region ER in the same way as in the first working example.

In addition, though a drawing has been omitted, it has been confirmed that various aberrations other than coma aberration, such as spherical aberration and distortion, are also corrected well in the region that corresponds to the effective image forming region ER.

THIRD WORKING EXAMPLE

Figure 7:
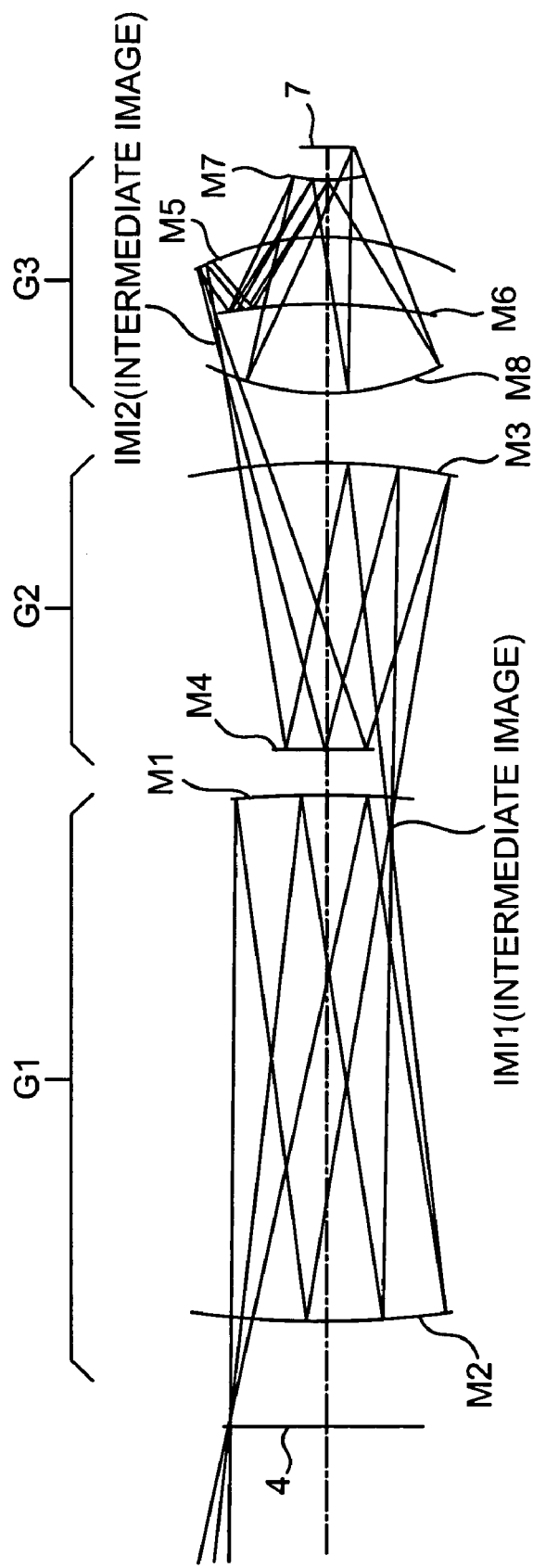
FIG. 7 is a drawing that shows the configuration of a projection optical system relating to the third working example of the present embodiment.

FIG. 7 is a drawing that shows the configuration of a projection optical system relating to the third working example of the present embodiment. Referring to FIG. 7, in the projection optical system of the third working example, the light from the mask 4 forms the first intermediate image IMI1 of the mask pattern after being sequentially reflected by the concave reflecting surface of the first reflecting mirror M1 and the concave reflecting surface of the second reflecting mirror M2. The light from the first intermediate image IMI1 formed via the first reflecting image forming optical system G1 forms the second intermediate image IMI2 of the mask pattern after being sequentially reflected by the concave reflecting surface of the third reflecting mirror M3 and the concave reflecting surface of the fourth reflecting mirror M4.

The light from the second intermediate image IMI2 formed via the second reflecting image forming optical system G2 forms a reduced image (tertiary image) of the mask pattern on the wafer 7 after being sequentially reflected by the concave reflecting surface of the fifth reflecting mirror M5 the convex reflecting surface of the sixth reflecting mirror M6, the convex reflecting surface of the seventh reflecting mirror M7, and the concave reflecting surface of the eighth reflecting mirror M8. In the third working example, an aperture stop (not shown in the drawing) is provided at a position in the vicinity of the reflecting surface of the fourth reflecting mirror M4.

Table (3) below presents the values of the specifications of the projection optical system relating to the third working example. In the main specifications column of Table (3), $\lambda$ denotes the wavelength of the exposure light, $\beta$ denotes the projection magnification, NA denotes the image side (wafer side) numerical aperture, $\phi$ denotes the radius (maximum image height) of the image circle IF on the wafer 7, LX denotes the dimensions of the effective image forming region ER along the X direction, and LY denotes the dimensions of the effective image forming region ER along the Y direction. In addition, in the conditional expression corresponding values column of Table (3), H0 denotes the maximum object height on the mask 4, M$\phi$ denotes the effective radius of the largest reflecting mirror, d4 denotes the distance along the optical axis from the fourth reflecting mirror M4 to the fifth reflecting mirror M5, d5 denotes the distance along the optical axis from the fifth reflecting mirror M5 to the sixth reflecting mirror M6, and d6 denotes the distance along the optical axis from the sixth reflecting mirror M6 to the seventh reflecting mirror M7.

In addition, the surface number denotes the sequence of reflecting surfaces from the mask side along the direction in which the light ray progresses from the mask surface, which is the object surface, to the wafer surface, which is the image surface, r denotes the vertex radii of curvature (mm) of the respective reflecting surfaces, and d denotes the axial intervals (mm) of the respective reflecting surfaces. Note that the code of the surface interval d is changed with each reflection. In addition, regardless of the direction of incidence of the light ray, facing the mask side, the radius of curvature of the convex surface is considered to be positive, and the radius of curvature of the concave surface is considered to be negative. The aforementioned notation is also the same in Tables (4) and (5) below.

TABLE (3)

(Main Specifications)

$\lambda$ = 13.5 nm
$\beta$ = ¼
NA = 0.40
$\phi$ = 49 mm
LX = 26 mm
LY = 2 mm (Optical Member Specifications)

| Surface Number | r | d | Optical Member |
|---|---|---|---|
|  | (Mask surface) | 1331.9 |  |
| 1 | −2663.8 | −1114.2 | (First reflecting mirror M1) |
| 2 | 1884.2 | 1832.6 | (Second reflecting mirror M2) |
| 3 | −1132.9 | −618.4 | (Third reflecting mirror M3) |
| 4 | 3701.1 | 1085.9 | (Fourth reflecting mirror M4) |
| 5 | −506.0 | −137.8 | (Fifth reflecting mirror M5) |
| 6 | −969.4 | 251.4 | (Sixth reflecting mirror M6) |
| 7 | 201.4 | −431.2 | (Seventh reflecting mirror M7) |
| 8 | 517.0 | 499.7 | (Eighth reflecting mirror M8) |
|  | (Wafer surface) |  |  |

(Aspheric Surface Data)

First surface $\kappa$ = 0.000000
$C_4$ = 0.376005 × 10$^{-9}$    $C_6$ = 0.182032 × 10$^{-14}$
$C_8$ = 0.156853 × 10$^{-19}$   $C_{10}$ = −0.787066 × 10$^{-25}$
$C_{12}$ = 0.128851 × 10$^{-28}$   $C_{14}$ = −0.337168 × 10$^{-33}$
$C_{16}$ = 0.586262 × 10$^{-38}$ Second surface $\kappa$ = 0.000000
$C_4$ = −0.118394 × 10$^{-9}$    $C_6$ = 0.102094 × 10$^{-15}$
$C_8$ = 0.201683 × 10$^{-21}$   $C_{10}$ = 0.211163 × 10$^{-26}$
$C_{12}$ = −0.584886 × 10$^{-31}$   $C_{14}$ = 0.592388 × 10$^{-36}$
$C_{16}$ = −0.244248 × 10$^{-41}$ Third surface $\kappa$ = 0.000000
$C_4$ = 0.250274 × 10$^{-9}$    $C_6$ = −0.121652 × 10$^{-14}$
$C_8$ = 0.847867 × 10$^{-20}$   $C_{10}$ = −0.852992 × 10$^{-25}$
$C_{12}$ = 0.694170 × 10$^{-30}$   $C_{14}$ = −0.519261 × 10$^{-35}$
$C_{16}$ = 0.229762 × 10$^{-40}$ Fourth surface $\kappa$ = 0.000000
$C_4$ = 0.706339 × 10$^{-9}$    $C_6$ = 0.275097 × 10$^{-13}$
$C_8$ = 0.271764 × 10$^{-18}$   $C_{10}$ = 0.148411 × 10$^{-21}$
$C_{12}$ = −0.173338 × 10$^{-25}$   $C_{14}$ = 0.143508 × 10$^{-29}$
$C_{16}$ = −0.360609 × 10$^{-34}$ Fifth surface $\kappa$ = 0.000000
$C_4$ = 0.766574 × 10$^{-9}$    $C_6$ = 0.101735 × 10$^{-13}$
$C_8$ = −0.803136 × 10$^{-18}$   $C_{10}$ = 0.253815 × 10$^{-22}$
$C_{12}$ = −0.373640 × 10$^{-27}$   $C_{14}$ = 0.272624 × 10$^{-32}$
$C_{16}$ = −0.794560 × 10$^{-38}$ Sixth surface $\kappa$ = 0.000000
$C_4$ = 0.544604 × 10$^{-8}$    $C_6$ = −0.468971 × 10$^{-13}$
$C_8$ = 0.118132 × 10$^{-17}$   $C_{10}$ = −0.467772 × 10$^{-22}$ TABLE (3)-continued $C_{12} = 0.110567 \times 10^{-26}$    $C_{14} = -0.132363 \times 10^{-31}$
$C_{16} = 0.636477 \times 10^{-37}$ Seventh surface $\kappa = 0.000000$
$C_4 = -0.139822 \times 10^{-7}$    $C_6 = 0.115093 \times 10^{-11}$
$C_8 = -0.727190 \times 10^{-16}$    $C_{10} = 0.300816 \times 10^{-19}$
$C_{12} = -0.698916 \times 10^{-23}$    $C_{14} = 0.124380 \times 10^{-26}$
$C_{16} = -0.106375 \times 10^{-30}$ Eighth surface $\kappa = 0.000000$
$C_4 = 0.104978 \times 10^{-9}$    $C_6 = 0.410888 \times 10^{-15}$
$C_8 = 0.155889 \times 10^{-20}$    $C_{10} = 0.569660 \times 10^{-26}$
$C_{12} = 0.241797 \times 10^{-31}$    $C_{14} = -0.175669 \times 10^{-37}$
$C_{16} = 0.938871 \times 10^{-42}$ (Conditional Expression Corresponding Values)

H0 = 196 mm
Mφ = 264.5 mm (Largest at the third reflecting mirror M3)
d4 = 1085.9 mm
d5 = 137.8 mm
d6 = 251.4 mm
(3) Mφ/H0 = 1.35
(5) d5/d4 = 0.127
(6) d6/d4 = 0.232

Figure 8:
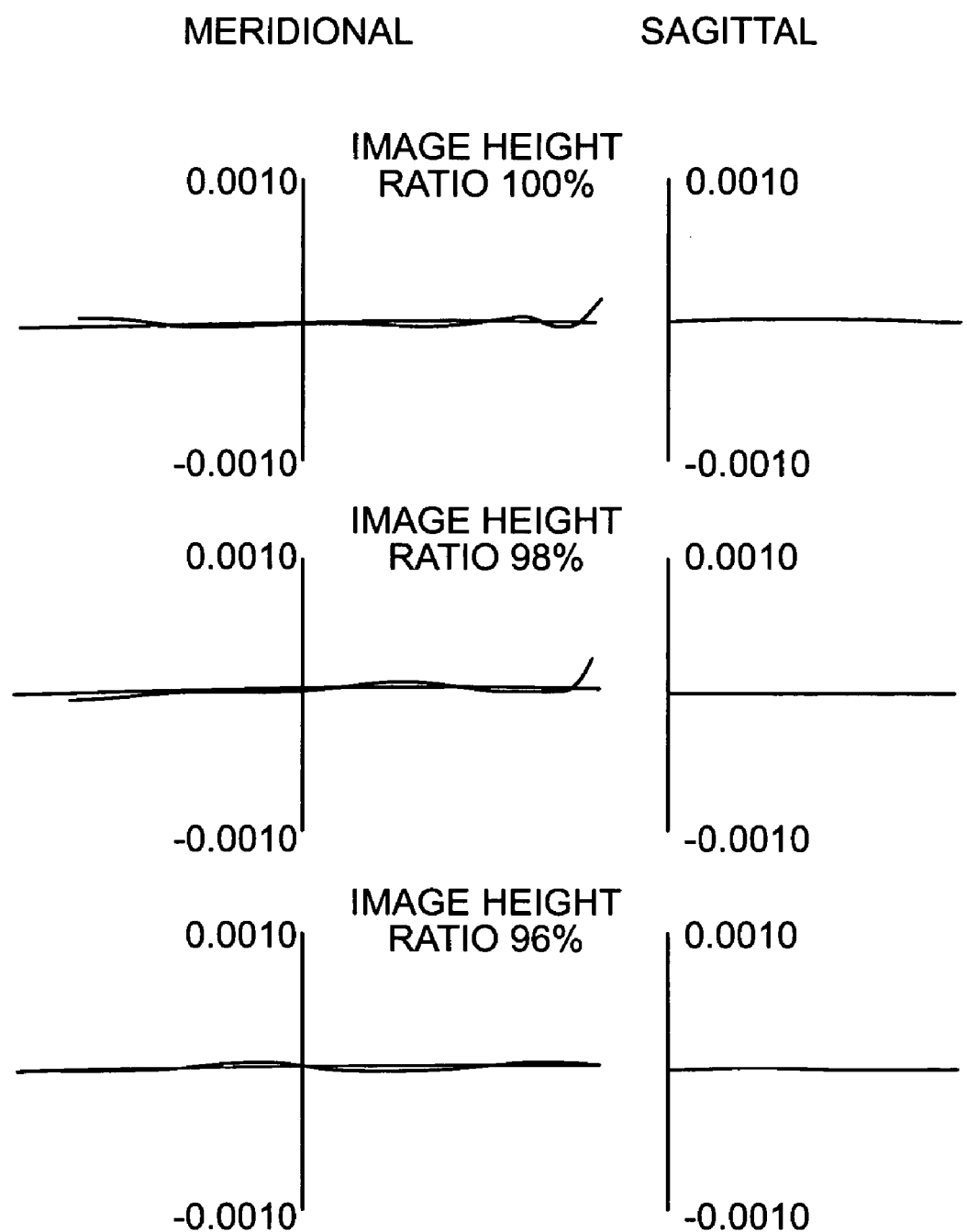
FIG. 8 is a drawing that shows coma aberration in the projection optical system of the third working example.

FIG. 8 is a drawing that shows coma aberration in the projection optical system of the third working example. FIG. 8 shows the meridional coma aberration and the sagittal coma aberration at image height ratio 100%, image height ratio 98% and image height ratio 96%. As is clear from the aberration diagram, it is understood that, in the third working example as well, coma aberration is corrected well in the region that corresponds to the effective image forming region ER in the same way as in the first working example and the second working example. In addition, though a drawing has been omitted, it has been confirmed that various aberrations other than coma aberration, such as spherical aberration and distortion, are also corrected well in the region that corresponds to the effective image forming region ER.

FOURTH WORKING EXAMPLE

Figure 9:
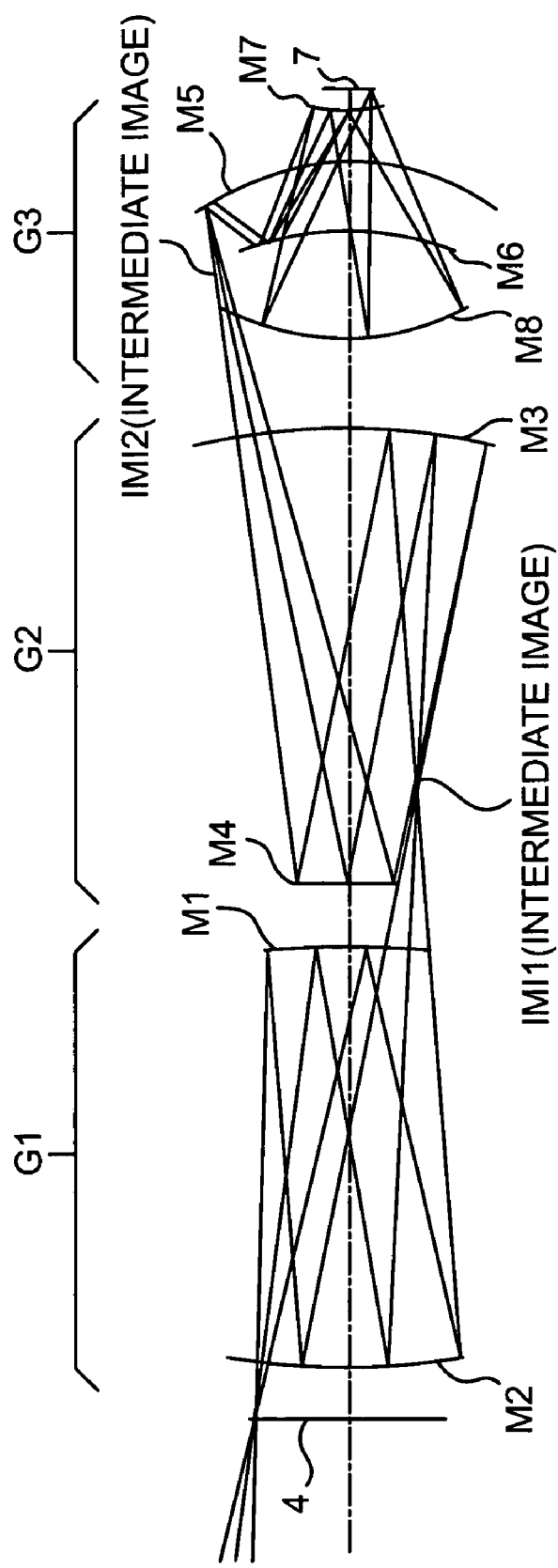
FIG. 9 is a drawing that shows the configuration of a projection optical system relating to the fourth working example of the present embodiment.

FIG. 9 is a drawing that shows the configuration of a projection optical system relating to the fourth working example of the present embodiment. Referring to FIG. 9, in the projection optical system of the fourth working example, the light from the mask 4 forms the first intermediate image IMI1 of the mask pattern after being sequentially reflected by the concave reflecting surface of the first reflecting mirror M1 and the concave reflecting surface of the second reflecting mirror M2. The light from the first intermediate image IMI1 formed via the first reflecting image forming optical system G1 forms the second intermediate image IMI2 of the mask pattern after being sequentially reflected by the concave reflecting surface of the third reflecting mirror M3 and the concave reflecting surface of the fourth reflecting mirror M4.

The light from the second intermediate image IMI2 formed via the second reflecting image forming optical system G2 forms a reduced image (tertiary image) of the mask pattern on the wafer 7 after being sequentially reflected by the concave reflecting surface of the fifth reflecting mirror M5, the convex reflecting surface of the sixth reflecting mirror M6, the convex reflecting surface of the seventh reflecting mirror M7, and the concave reflecting surface of the eighth reflecting mirror M8. In the above way, the projection optical system of the fourth working example has the same configuration as the projection optical system of the third working example. In addition, in the fourth working example as well, an aperture stop (not shown in the drawing) is provided at a position in the vicinity of the reflecting surface of the fourth reflecting mirror M4 in the same way as in the third working example. Table (4) below presents the values of the specifications of the projection optical system relating to the fourth working example.

TABLE (4)

(Main Specifications)

λ = 13.5 nm
β = ¼
NA = 0.40
φ = 45 mm
LX = 26 mm
LY = 2 mm (Optical Member Specifications)

| Surface Number | r | d | Optical Member |
|---|---|---|---|
|  | (Mask surface) | 938.0 |  |
| 1 | −4500.3 | −838.0 | (First reflecting mirror M1) |
| 2 | 1492.0 | 1894.7 | (Second reflecting mirror M2) |
| 3 | −1474.4 | −926.6 | (Third reflecting mirror M3) |
| 4 | 3299.1 | 1457.8 | (Fourth reflecting mirror M4) |
| 5 | −432.1 | −137.4 | (Fifth reflecting mirror M5) |
| 6 | −371.8 | 234.6 | (Sixth reflecting mirror M6) |
| 7 | 290.3 | −447.0 | (Seventh reflecting mirror M7) |
| 8 | 517.5 | 487.0 | (Eighth reflecting mirror M8) |
|  | (Wafer surface) |  |  |

(Aspheric Surface Data)

First surface $\kappa = 0.000000$
$C_4 = 0.854996 \times 10^{-9}$    $C_6 = -0.475389 \times 10^{-14}$
$C_8 = -0.201483 \times 10^{-19}$    $C_{10} = 0.114775 \times 10^{-23}$
$C_{12} = 0.270326 \times 10^{-28}$    $C_{14} = -0.470048 \times 10^{-33}$
$C_{16} = -0.998173 \times 10^{-38}$ Second surface $\kappa = 0.000000$
$C_4 = -0.145803 \times 10^{-9}$    $C_6 = 0.167018 \times 10^{-18}$
$C_8 = 0.432608 \times 10^{-21}$    $C_{10} = 0.694633 \times 10^{-26}$
$C_{12} = -0.206028 \times 10^{-30}$    $C_{14} = 0.281403 \times 10^{-35}$
$C_{16} = -0.160816 \times 10^{-40}$ Third surface $\kappa = 0.000000$
$C_4 = -0.556168 \times 10^{-10}$    $C_6 = -0.612263 \times 10^{-15}$
$C_8 = 0.554108 \times 10^{-20}$    $C_{10} = -0.240010 \times 10^{-25}$
$C_{12} = 0.854573 \times 10^{-32}$    $C_{14} = 0.923964 \times 10^{-36}$
$C_{16} = -0.545633 \times 10^{-41}$ Fourth surface $\kappa = 0.000000$
$C_4 = 0.155488 \times 10^{-8}$    $C_6 = 0.924077 \times 10^{-14}$
$C_8 = 0.936845 \times 10^{-19}$    $C_{10} = -0.232354 \times 10^{-22}$
$C_{12} = 0.313243 \times 10^{-26}$    $C_{14} = -0.214867 \times 10^{-30}$
$C_{16} = 0.594030 \times 10^{-35}$ Fifth surface $\kappa = 0.000000$
$C_4 = 0.461229 \times 10^{-9}$    $C_6 = 0.475149 \times 10^{-13}$ TABLE (4)-continued $C_8 = -0.140154 \times 10^{-17}$      $C_{10} = 0.254331 \times 10^{-22}$
$C_{12} = -0.270811 \times 10^{-27}$    $C_{14} = 0.160432 \times 10^{-32}$
$C_{16} = -0.402361 \times 10^{-38}$ Sixth surface $\kappa = 0.000000$
$C_4 = 0.155013 \times 10^{-7}$         $C_6 = -0.190659 \times 10^{-12}$
$C_8 = 0.210945 \times 10^{-17}$        $C_{10} = 0.510947 \times 10^{-22}$
$C_{12} = -0.299461 \times 10^{-26}$    $C_{14} = 0.601177 \times 10^{-31}$
$C_{16} = -0.465302 \times 10^{-36}$ Seventh surface $\kappa = 0.000000$
$C_4 = 0.346619 \times 10^{-7}$         $C_6 = 0.234019 \times 10^{-11}$
$C_8 = 0.222764 \times 10^{-16}$        $C_{10} = -0.105228 \times 10^{-19}$
$C_{12} = 0.592445 \times 10^{-23}$     $C_{14} = -0.114659 \times 10^{-26}$
$C_{16} = 0.865774 \times 10^{-31}$ Eighth surface $\kappa = 0.000000$
$C_4 = 0.515678 \times 10^{-10}$        $C_6 = 0.218527 \times 10^{-15}$
$C_8 = 0.887551 \times 10^{-21}$        $C_{10} = -0.372574 \times 10^{-27}$
$C_{12} = 0.959645 \times 10^{-31}$     $C_{14} = -0.111348 \times 10^{-35}$
$C_{16} = 0.646376 \times 10^{-41}$ (Conditional Expression Corresponding Values)

H0 = 180 mm
M$\phi$ = 280.9 mm (Largest at the fifth reflecting mirror M5)
d4 = 1457.8 mm
d5 = 137.4 mm
d6 = 234.6 mm
(3) M$\phi$/H0 = 1.56
(5) d5/d4 = 0.094
(6) d6/d4 = 0.161

Figure 10:
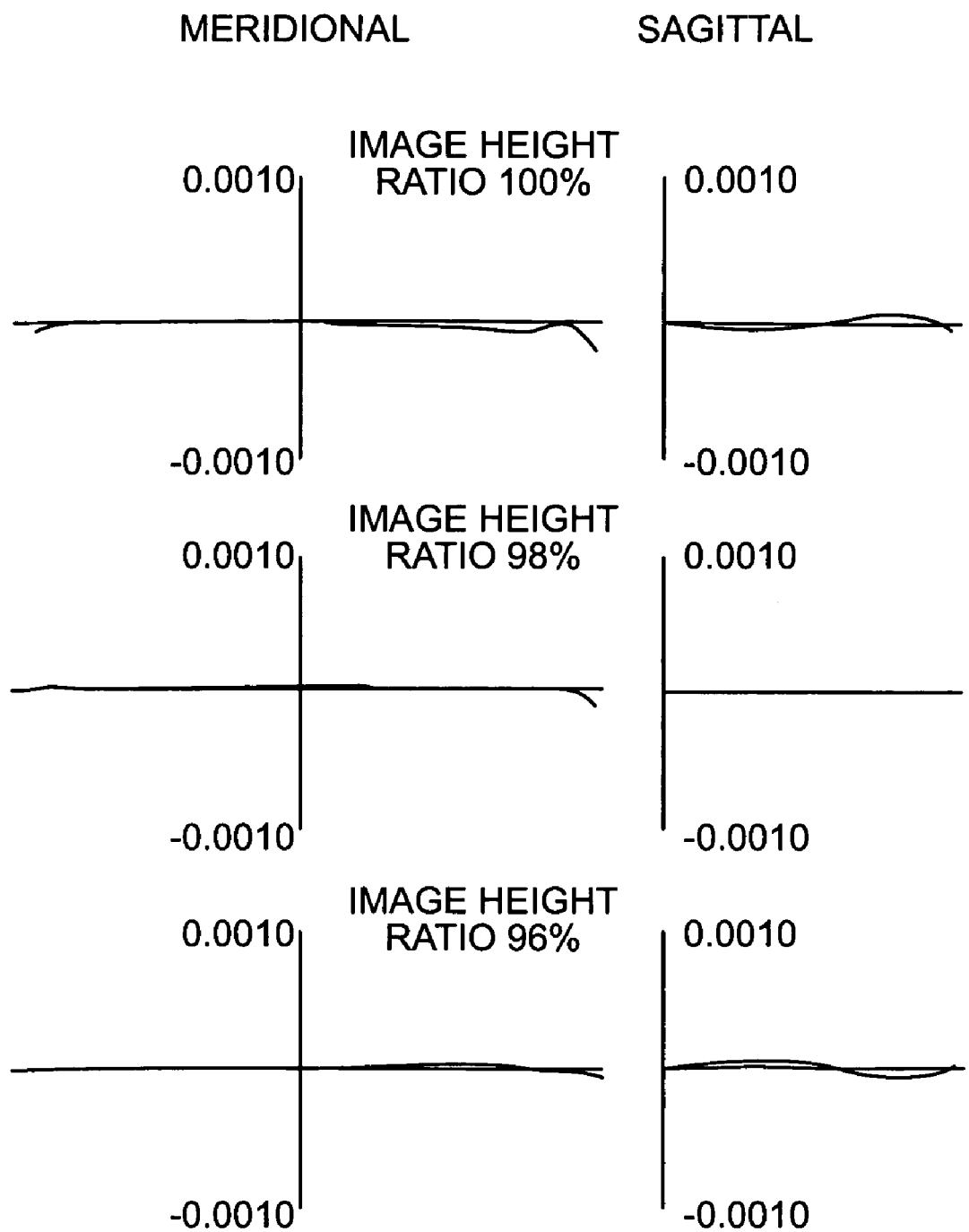
FIG. 10 is a drawing that shows coma aberration in the projection optical system of the fourth working example.

FIG. 10 is a drawing that shows coma aberration in the projection optical system of the fourth working example. FIG. 10 shows the meridional coma aberration and the sagittal coma aberration at image height ratio 100%, image height ratio 98% and image height ratio 96%. As is clear from the aberration diagram, it is understood that, in the fourth working example as well, coma aberration is corrected well in the region that corresponds to the effective image forming region ER in the same way as in the first working example~third working example. In addition, though a drawing has been omitted, it has been confirmed that various aberrations other than coma aberration, such as spherical aberration and distortion, are also corrected well in the region that corresponds to the effective image forming region ER.

FOURTH [SIC; FIFTH] WORKING EXAMPLE

Figure 11:
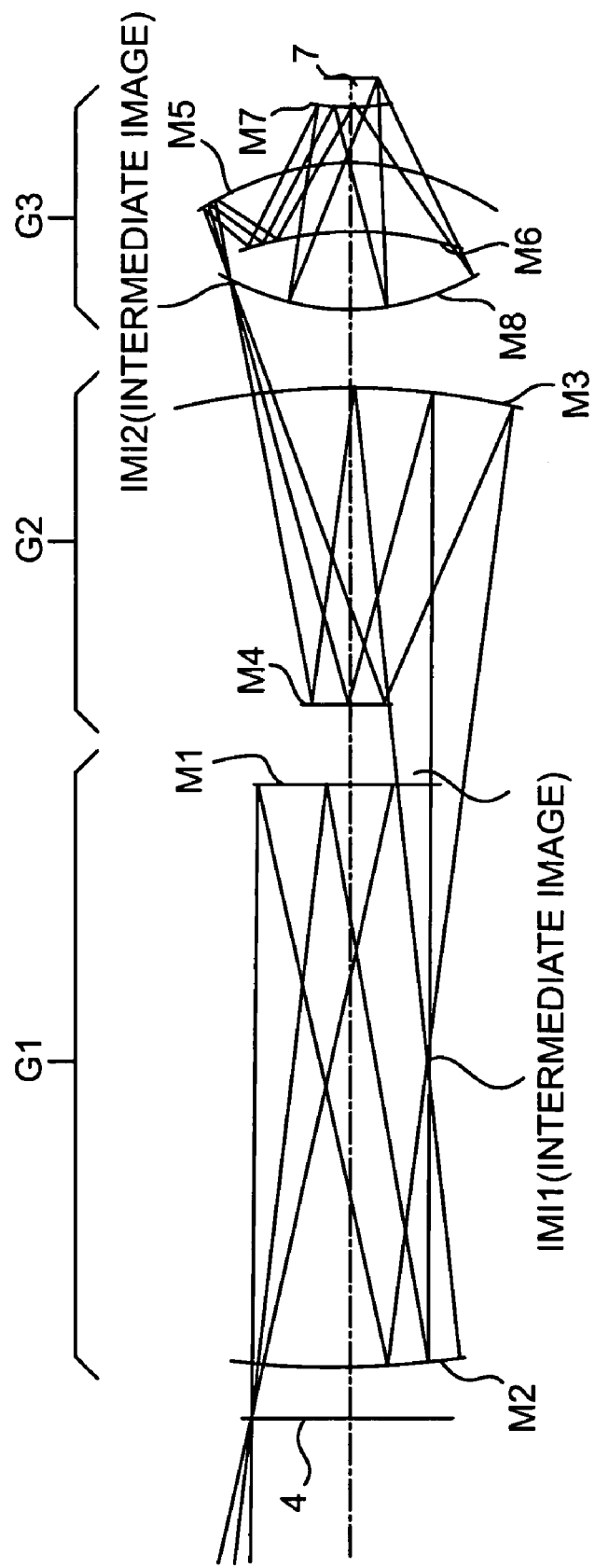
FIG. 11 is a drawing that shows the configuration of a projection optical system relating to the fifth working example of the present embodiment.

FIG. 11 is a drawing that shows the configuration of a projection optical system relating to the fifth working example of the present embodiment. Referring to FIG. 11, in the projection optical system of the fifth working example, the light from the mask 4 forms the first intermediate image IMI1 of the mask pattern after being sequentially reflected by the concave reflecting surface of the first reflecting mirror M1 and the concave reflecting surface of the second reflecting mirror M2. The light from the first intermediate image IMI1 formed via the first reflecting image forming optical system G1 forms the second intermediate image IMI2 of the mask pattern after being sequentially reflected by the concave reflecting surface of the third reflecting mirror M3 and the convex reflecting surface of the fourth reflecting mirror M4.

The light from the second intermediate image IMI2 formed via the second reflecting image forming optical system G2 forms a reduced image (tertiary image) of the mask pattern on the wafer 7 after being sequentially reflected by the concave reflecting surface of the fifth reflecting mirror M5, the convex reflecting surface of the sixth reflecting mirror M6, the convex reflecting surface of the seventh reflecting mirror M7, and the concave reflecting surface of the eighth reflecting mirror M8. In the above way, the projection optical system of the fifth working example has a similar configuration to that of the projection optical system of the third working example, but it differs from the third working example in that the reflecting surface of the fourth reflecting mirror M4 is convex. In addition, in the fifth working example as well, an aperture stop (not shown in the drawing) is provided at a position in the vicinity of the reflecting surface of the fourth reflecting mirror M4 in the same way as in the third working example. The values of the specifications of the projection optical system relating to the fifth working example are presented in Table (5) below.

TABLE (5)

(Main Specifications)

$\lambda$ = 13.5 nm
$\beta$ = ¼
NA = 0.40
$\phi$ = 44 mm
LX = 26 mm
LY = 2 mm (Optical Member Specifications)

| Surface Number | r | d | Optical Member |
| --- | --- | --- | --- |
|  | (Mask surface) | 1178.5 |  |
| 1 | −1544.3 | −1078.5 | (First reflecting mirror M1) |
| 2 | 1718.7 | 1823.5 | (Second reflecting mirror M2) |
| 3 | −1160.9 | −591.6 | (Third reflecting mirror M3) |
| 4 | −1901.3 | 1007.5 | (Fourth reflecting mirror M4) |
| 5 | −403.5 | −127.3 | (Fifth reflecting mirror M5) |
| 6 | −487.6 | 224.3 | (Sixth reflecting mirror M6) |
| 7 | 234.4 | −362.9 | (Seventh reflecting mirror M7) |
| 8 | 434.7 | 415.1 | (Eighth reflecting mirror M8) |
|  | (Wafer surface) |  |  |

(Aspheric Surface Data)

First surface $\kappa = 0.000000$
$C_4 = 0.231571 \times 10^{-9}$         $C_6 = 0.121887 \times 10^{-14}$
$C_8 = 0.431280 \times 10^{-20}$        $C_{10} = 0.244468 \times 10^{-24}$
$C_{12} = -0.494136 \times 10^{-29}$    $C_{14} = 0.638817 \times 10^{-34}$
$C_{16} = -0.239065 \times 10^{-39}$ Second surface $\kappa = 0.000000$
$C_4 = -0.368731 \times 10^{-9}$        $C_6 = 0.792402 \times 10^{-17}$
$C_8 = -0.743340 \times 10^{-20}$       $C_{10} = 0.505399 \times 10^{-24}$
$C_{12} = -0.150979 \times 10^{-28}$    $C_{14} = 0.239336 \times 10^{-33}$
$C_{16} = -0.151068 \times 10^{-38}$ Third surface $\kappa = 0.000000$
$C_4 = -0.436493 \times 10^{-11}$       $C_6 = -0.112575 \times 10^{-15}$
$C_8 = -0.234158 \times 10^{-21}$       $C_{10} = 0.738850 \times 10^{-27}$
$C_{12} = -0.142461 \times 10^{-31}$    $C_{14} = 0.549051 \times 10^{-37}$
$C_{16} = -0.177829 \times 10^{-42}$ TABLE (5)-continued Fourth surface $\kappa = 0.000000$
$C_4 = 0.272542 \times 10^{-8}$     $C_6 = -0.862336 \times 10^{-14}$
$C_8 = -0.290743 \times 10^{-18}$   $C_{10} = 0.328569 \times 10^{-21}$
$C_{12} = -0.731631 \times 10^{-25}$ $C_{14} = 0.839298 \times 10^{-29}$
$C_{16} = -0.383443 \times 10^{-33}$ Fifth surface $\kappa = 0.000000$
$C_4 = 0.114214 \times 10^{-8}$     $C_6 = 0.140842 \times 10^{-13}$
$C_8 = -0.827726 \times 10^{-18}$   $C_{10} = 0.251783 \times 10^{-22}$
$C_{12} = -0.394160 \times 10^{-27}$ $C_{14} = 0.321773 \times 10^{-32}$
$C_{16} = -0.105868 \times 10^{-37}$ Sixth surface $\kappa = 0.000000$
$C_4 = 0.106948 \times 10^{-7}$     $C_6 = -0.197037 \times 10^{-12}$
$C_8 = 0.330423 \times 10^{-17}$    $C_{10} = 0.186892 \times 10^{-22}$
$C_{12} = -0.235952 \times 10^{-26}$ $C_{14} = 0.477465 \times 10^{-31}$
$C_{16} = -0.342664 \times 10^{-36}$ Seventh surface $\kappa = 0.000000$
$C_4 = 0.389494 \times 10^{-7}$     $C_6 = 0.251770 \times 10^{-11}$
$C_8 = 0.832026 \times 10^{-16}$    $C_{10} = -0.142242 \times 10^{-20}$
$C_{12} = -0.179862 \times 10^{-24}$ $C_{14} = 0.367202 \times 10^{-27}$
$C_{16} = -0.290292 \times 10^{-31}$ Eighth surface $\kappa = 0.000000$
$C_4 = 0.793865 \times 10^{-10}$    $C_6 = 0.681225 \times 10^{-15}$
$C_8 = 0.403356 \times 10^{-20}$    $C_{10} = 0.281988 \times 10^{-26}$
$C_{12} = 0.474794 \times 10^{-30}$ $C_{14} = -0.404330 \times 10^{-35}$
$C_{16} = 0.277730 \times 10^{-40}$ (Conditional Expression Corresponding Values)

H0 = 176 mm
Mφ = 300.6 mm (Largest at the third reflecting mirror M3)
d4 = 1007.5 mm
d5 = 127.3 mm
d6 = 224.3 mm
(3) Mφ/H0 = 1.71
(5) d5/d4 = 0.126
(6) d6/d4 = 0.223

Figure 12:
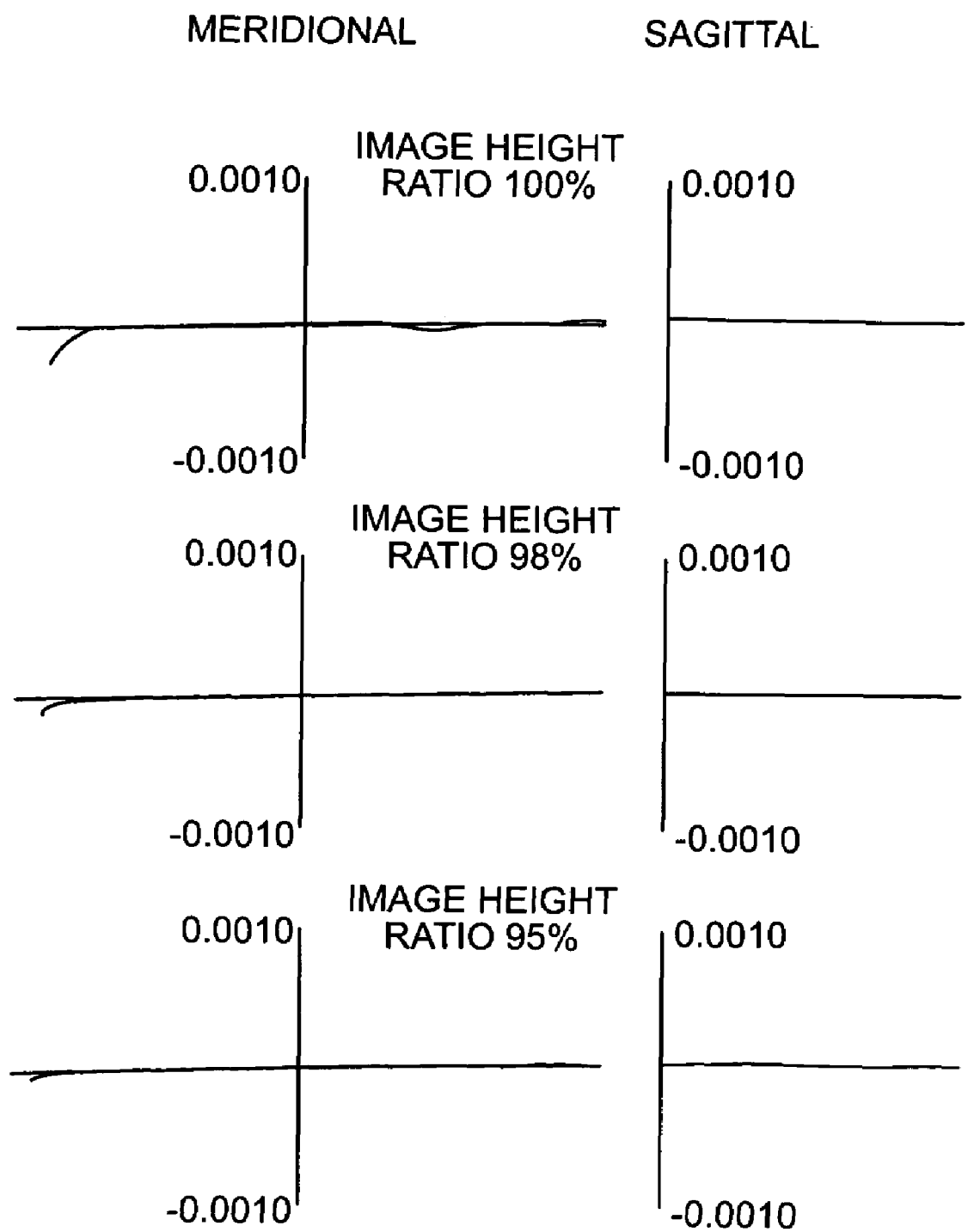
FIG. 12 is a drawing that shows coma aberration in the projection optical system of the fifth working example.

FIG. 12 is a drawing that shows coma aberration in the projection optical system of the fifth working example. FIG. 12 shows the meridional coma aberration and the sagittal coma aberration at image height ratio 100%, image height ratio 98% and image height ratio 95%. As is clear from the aberration diagram, it is understood that, in the fifth working example as well, coma aberration is corrected well in the region that corresponds to the effective image forming region ER in the same way as in the first working example~fourth working example. In addition, though a drawing has been omitted, it has been confirmed that various aberrations other than coma aberration, such as spherical aberration and distortion, are also corrected well in the region that corresponds to the effective image forming region ER.

In the above way, in the first working example and the second working example, it is possible to ensure a 26 mm×2 mm arc-shaped effective image forming region in which the various aberrations have been corrected well on the wafer 7 while ensuring an extremely large image side numerical aperture of 0.5 with respect to a laser plasma x-ray with a wavelength of 13.5 nm. In addition, in the third working example~fifth working example, it is possible to ensure a 26 mm×2 mm arc-shaped effective image forming region in which the various aberrations have been corrected well on the wafer 7 while ensuring a relatively large image side numerical aperture of 0.4 with respect to a laser plasma x-ray with a wavelength of 13.5 nm. Therefore, in the wafer 7, it is possible to transfer the pattern of the mask 4 to the respective exposure regions that have, for example, a size of 26 mm×66 mm at a high resolution of 0.1 μm or less through scanning exposure.

In addition, in the first working example, the effective radius Mφ of the sixth reflecting mirror M6, which is the largest, is approximately 256 mm, the ratio Mφ/H0 of the maximum effective radius Mφ to the maximum object height H0 is approximately 1.49, which is kept sufficiently small in comparison to the prior art. Also, the distance from the object (mask) to the image (wafer), that is, the total length TT of the optical system is approximately 2075 mm, and the ratio TT/H0 of the total length TT to the maximum object height H0 is approximately 12.1, which is kept sufficiently small in comparison to the prior art. In this way, in the first working example, compactness of the optical system is achieved in the radial direction and the axial direction, and a relatively large image side numerical aperture, at 0.5, is ensured in comparison with the prior art.

On the other hand, in the second working example, the effective radius Mφ of the seventh reflecting mirror M7, which is the largest, is approximately 308 mm, the ratio Mφ/H0 of the maximum effective radius Mφ to the maximum object height H0 is approximately 1.45, which is kept sufficiently small in comparison to the prior art. Also, the total length TT of the optical system is approximately 2600 mm, and the ratio TT/H0 of the total length TT to the maximum object height H0 is approximately 12.3, which is kept sufficiently small in comparison to the prior art. In this way, in the second working example as well, compactness of the optical system is achieved in the radial direction and the axial direction, and a relatively large image side numerical aperture, at 0.5, is ensured in comparison with the prior art in the same way as in the first working example.

In addition, in the third working example~fifth working example, the effective radius Mφ of the largest reflecting mirror is approximately 265 mm~301 mm, which is kept sufficiently small. In this way, in the third working example~fifth working example, the reflecting mirror is kept from becoming larger in the radial direction and, in turn, compactness of the optical system in the radial direction is achieved. In the third working example~fifth working example, the distance (object-to-image distance) TT from the object (mask) to the image (wafer) is held to a range of 2489 mm~2700 mm, so optical performance is also well-maintained while keeping the optical system from becoming larger in the radial direction.

In an exposure apparatus relating to the aforementioned embodiment, by illuminating the mask by means of an illumination system (illumination process) and exposing the pattern for transfer formed on the mask onto a photosensitive substrate using a projection optical system (exposure process), it is possible to manufacture micro devices (semiconductor devices, image pickup elements, liquid crystal display elements, thin-film magnetic heads, etc.). An example of the technique when obtaining a semiconductor device as a micro device by forming a prescribed circuit pattern on a wafer, etc. as the photosensitive substrate using an exposure apparatus of the present embodiment will be explained below while referring to the flowchart in FIG. 13.

Figure 13:
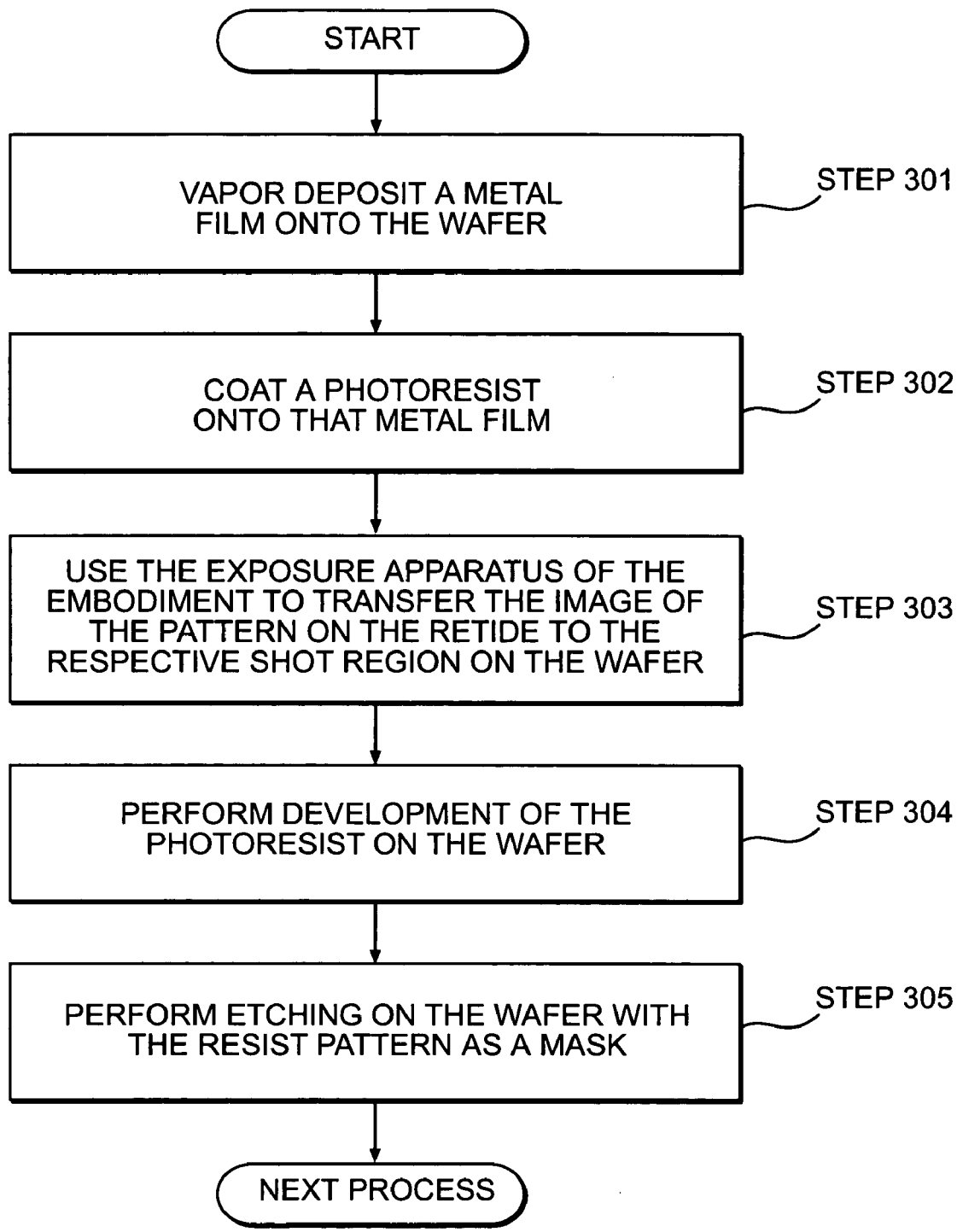
FIG. 13 is a drawing that shows an example of the technique when obtaining a semiconductor device as the micro device as well as a flowchart thereof.

First, in step 301 in FIG. 13, a metal film is vapor deposited onto a wafer of the first lot. Next, in step 302, a photoresist is coated onto the metal film on the wafer of that first lot. After that, in step 303, an exposure apparatus of the present embodiment is used to sequentially transfer the pattern image on the mask (reticle) to the respective shot regions on the wafer of that first lot using that projection optical system.

After that, in step 304, after development of the photoresist on the wafer of that first lot is performed, in step 305, a circuit pattern that corresponds to the pattern on the mask is formed on the respective shot regions on the respective wafers by performing etching with the resist pattern on the wafer of that first lot as a mask. After that, a device such as a semiconductor device is manufactured by performing formation etc. of a circuit pattern of a layer that is further above. Through the aforementioned semiconductor device manufacturing method, it is possible to obtain semiconductor devices that have extremely fine circuit patterns at high throughput.

Note that, in the aforementioned present embodiment, a laser plasma x-ray source is used as the light source for supplying x-rays, but it is not limited to this, and it is also possible to use, for example, synchrotron radiation (SOR) light as the x-rays.

In addition, in the aforementioned present embodiment, the present invention is applied to an exposure apparatus that has a light source for supplying x-rays, but it is not limited to this, and the present invention may also be applied to exposure apparatuses that have light source that supplies light that has wavelengths other than that of x-rays. Also, in the aforementioned present embodiment, the present invention is applied to a projection optical system of an exposure apparatus, but it is not limited to this, and it is also possible to apply the present invention to other general projection optical systems.

The invention claimed is:

1. A projection optical system for projecting a reduced image of a first surface on a second surface; the projection optical system comprising at least ten reflecting mirrors; the mirrors defining:
    a first reflecting image forming optical system G1 for forming a first intermediate image of the first surface based on light from the first surface, a second reflecting image forming optical system G2 for forming a second intermediate image of the first surface based on light from the first intermediate image, and a third reflecting image forming optical system G3 for forming the reduced image on the second surface based on light from the second intermediate image, wherein
    the number of reflecting mirrors comprising the third reflecting image forming optical system G3 is greater than the number of reflecting mirrors comprising the first reflecting image forming optical system G1 and is greater than or equal to the number of reflecting mirrors comprising the second reflecting image forming optical system G2;
    the third reflecting image forming optical system G3 has four or more reflecting mirrors;
    the first reflecting image forming optical system G1 has a first reflecting mirror M1 and a second reflecting mirror M2 in order of the incidence of light from the first surface;
    the second reflecting image forming optical system G2 has a third reflecting mirror M3, a fourth reflecting mirror M4, a fifth reflecting mirror M5, and a sixth reflecting mirror M6 in order of the incidence of light from the first intermediate image; and
    the third reflecting image forming optical system G3 has a seventh reflecting mirror M7, an eighth reflecting mirror M8, a ninth reflecting mirror M9, and a tenth reflecting mirror M10 in order of the incidence of light from the second intermediate image.

2. The projection optical system described in claim 1; wherein $$0.5 < M\phi/H0 < 2.5$$

when the maximum object height of said first surface is H0, and the maximum value of the effective radii of said ten reflecting mirrors is $M\phi$.

3. The projection optical system described in claim 1; wherein $$10 < TT/H0 < 15$$

when the maximum object height of said first surface is H0, and the axial interval between said first surface and said second surface is TT.

4. The projection optical system described in claim 1; further comprising:
    an aperture stop at or near the position of the reflecting surface of the fourth reflecting mirror M4.

5. The projection optical system described in claim 1; further comprising:
    an aperture stop at or near the position of the reflecting surface of the fifth reflecting mirror M5.

6. The projection optical system described in claim 2; wherein
    the numerical aperture NA of the second surface side is 0.45 or higher.

7. A projection optical system for protecting a reduced image of a first surface on a second surface; the projection optical system comprising at least eight reflecting mirrors; the mirrors defining:
    a first reflecting image forming optical system G1 for forming a first intermediate image of the first surface based on light from the first surface, a second reflecting image forming optical system G2 for forming a second intermediate image of the first surface based on light from the first intermediate image, and a third reflecting image forming optical system G3 for forming the reduced image on the second surface based on light from the second intermediate image, wherein
    the number of reflecting mirrors comprising the third reflecting image forming optical system G3 is greater than the number of reflecting mirrors comprising the first reflecting image forming optical system G1 and is greater than the number of reflecting mirrors comprising the second reflecting image forming optical system G2;
    the first reflecting image forming optical system G1 has a first reflecting mirror M1 and a second reflecting mirror M2 in order of the incidence of light from the first surface;
    the second reflecting image forming optical system G2 has a third reflecting mirror M3 and a fourth reflecting mirror M4 in order of the incidence of light from the first intermediate image;
    and the third reflecting image forming optical system G3 has a fifth reflecting mirror M5, a sixth reflecting mirror M6, a seventh reflecting mirror M7, and an eighth reflecting mirror M8 in order of the incidence of light from said second intermediate image.

8. The projection optical system described in claim 7; wherein $$0.7 < M\phi/H0 < 2.5$$

when the maximum object height of the first surface is H0, and the maximum value of the effective radii among the eight reflecting mirrors is Mφ.

9. The projection optical system described in claim 8; wherein
the maximum value Mφ among the eight reflecting mirrors satisfies the condition 200 mm<Mφ<350 mm.

10. The projection optical system described in claim 7; wherein 0.05<d5/d4<0.5 when the distance along the optical axis from the fourth reflecting mirror M4 to the fifth reflecting mirror M5 is d4, and the distance along the optical axis from the fifth reflecting mirror M5 to the sixth reflecting mirror M6 is d5.

11. The projection optical system described in claim 7; wherein 0.1<d6/d4<1.0 when the distance along the optical axis from the fourth reflecting mirror M4 to the fifth reflecting mirror M5 is d4, and the distance along the optical axis from the sixth reflecting mirror M6 to the seventh reflecting mirror M7 is d6.

12. The projection optical system described in claim 7; further comprising
an aperture stop at the position of the reflecting surface of said fourth reflecting mirror M4.

13. The projection optical system described in claim 7; wherein
the numerical aperture NA of the second surface side is 0.30 or higher.

14. The projection optical system described in claim 1; wherein
the first reflecting image forming optical system G1 includes at least one concave reflecting mirror.

15. The projection optical system described in claim 1; wherein
the second reflecting image forming optical system G2 includes at least one concave reflecting mirror.

16. The projection optical system described in claim 1; wherein
the third reflecting image forming optical system G3 includes at least one concave reflecting mirror.

17. An exposure apparatus comprising the projection optical system described in claim 1 and an illumination system for illuminating a mask on the first surface, the projection optical system described in claim 1 being for projecting the pattern of the mask onto a photosensitive substrate on the second surface.

18. A method for projecting a reduced image of a first surface on a second surface, the method comprising the steps of:
providing a projection optical system comprising at least ten reflecting mirrors, the mirrors defining a first reflecting image forming optical system G1 for forming a first intermediate image of the first surface based on light from the first surface, a second reflecting image forming optical system G2 for forming a second intermediate image of the first surface based on light from the first intermediate image, and a third reflecting image forming optical system G3 for forming the reduced image on the second surface based on light from the second intermediate image;

providing an image at the first surface; and
projecting the image onto the second surface using the projection optical system; wherein
the number of reflecting mirrors comprising the third reflecting image forming optical system G3 is greater than the number of reflecting mirrors comprising the first reflecting image forming optical system G1 and is greater than or equal to the number of reflecting mirrors comprising the second reflecting image forming optical system G2;
the third reflecting image forming optical system G3 has four or more reflecting mirrors;
the first reflecting image forming optical system G1 has a first reflecting mirror M1 and a second reflecting mirror M2 in order of the incidence of light from the first surface;
the second reflecting image forming optical system G2 has a third reflecting mirror M3, a fourth reflecting mirror M4, a fifth reflecting mirror M5, and a sixth reflecting mirror M6 in order of the incidence of light from the first intermediate image; and
the third reflecting image forming optical system G3 has a seventh reflecting mirror M7, an eighth reflecting mirror M8, a ninth reflecting mirror M9, and a tenth reflecting mirror M10 in order of the incidence of light from the second intermediate image.

19. A method of manufacturing a device comprising the steps of:
exposing a photosensitive substrate to an image on a mask using the method for projecting a reduced image described in claim 18; and
developing the photo sensitive substrate.

20. The projection optical system described in claim 7; wherein
the second reflecting image forming optical system G2 includes at least one concave reflecting mirror.

21. The projection optical system described in claim 7; wherein
the third reflecting image forming optical system G3 includes at least one concave reflecting mirror.

22. An exposure apparatus comprising the projection optical system described in claim 7 and an illumination system for illuminating a mask on the first surface, the projection optical system described in claim 7 being for projecting the pattern of the mask onto a photosensitive substrate on the second surface.

23. A method for projecting a reduced image of a first surface on a second surface, the method comprising the steps of:
providing a projection optical system comprising at least eight reflecting mirrors, the mirrors defining a first reflecting image forming optical system G1 for forming a first intermediate image of the first surface based on light from the first surface, a second reflecting image forming optical system G2 for forming a second intermediate image of the first surface based on light from the first intermediate image, and a third reflecting image forming optical system G3 for forming the reduced image on the second surface based on light from the second intermediate image;
providing an image at the first surface; and
projecting the image onto the second surface using the projection optical system; wherein
the number of reflecting mirrors comprising the third reflecting image forming optical system G3 is greater than the number of reflecting mirrors comprising the first reflecting image forming optical system G1 and is greater than the number of reflecting mirrors comprising the second reflecting image forming optical system G2;

the first reflecting image forming optical system G1 has a first reflecting mirror M1 and a second reflecting mirror M2 in order of the incidence of light from the first surface;

the second reflecting image forming optical system G2 has a third reflecting mirror M3 and a fourth reflecting mirror M4 in order of the incidence of light from the first intermediate image; and the third reflecting image forming optical system G3 has a fifth reflecting mirror M5, a sixth reflecting mirror M6, a seventh reflecting mirror M7, and an eighth reflecting mirror M8 in order of the incidence of light from said second intermediate image.

24. A method of manufacturing a device comprising the steps of:

exposing a photosensitive substrate to an image on a mask using the method for projecting a reduced image described in claim 23; and developing the photo sensitive substrate.

* * * * *

(12) INTER PARTES REEXAMINATION CERTIFICATE (509th)
United States Patent
Takahashi

(10) Number: US 7,283,206 C1
(45) Certificate Issued: Jan. 11, 2013

(54) PROJECTION OPTICAL SYSTEM, EXPOSURE APPARATUS, AND DEVICE MANUFACTURING METHOD

(75) Inventor: Tomowaki Takahashi, Yokohama (JP)

(73) Assignee: Nikon Corporation, Chiyoda-Ku, Tokyo (JP)

Reexamination Request:
No. 95/001,524, Jan. 14, 2011

Reexamination Certificate for:
Patent No.: 7,283,206
Issued: Oct. 16, 2007
Appl. No.: 11/353,005
Filed: Feb. 14, 2006

(30) Foreign Application Priority Data

Feb. 15, 2005 (JP) .................................. 2005-038401
Nov. 4, 2005 (JP) .................................. 2005-320423

(51) Int. Cl.
*G03B 27/54* (2006.01)
*G03B 27/42* (2006.01)
*G02B 5/10* (2006.01)

(52) U.S. Cl. ............................. 355/67; 355/53; 359/859

(58) Field of Classification Search .................... 355/67
See application file for complete search history.

(56) References Cited

To view the complete listing of prior art documents cited during the proceeding for Reexamination Control Number 95/001,524, please refer to the USPTO's public Patent Application Information Retrieval (PAIR) system under the Display References tab.

*Primary Examiner* — Deandra M. Hughes

(57) ABSTRACT

A projection optical system has at least eight reflecting mirrors and is relatively compact in the radial direction. The eight reflecting mirrors (M1~M8) form a reduced image of a first surface on a second surface. A first reflecting image forming optical system (G1) forms a first intermediate image (IMI1) of the first surface based on light from the first surface, a second reflecting image forming optical system (G2) forms a second intermediate image (IMI2) of the first surface based on light from the first intermediate image, and a third reflecting image forming optical system (G3) forms a reduced image on the second surface based on light from the second intermediate image. The number of reflecting mirrors (M6~M8) of the third reflecting image forming optical system is greater than the number of reflecting mirrors (M1, M2) of the first reflecting image forming optical system.

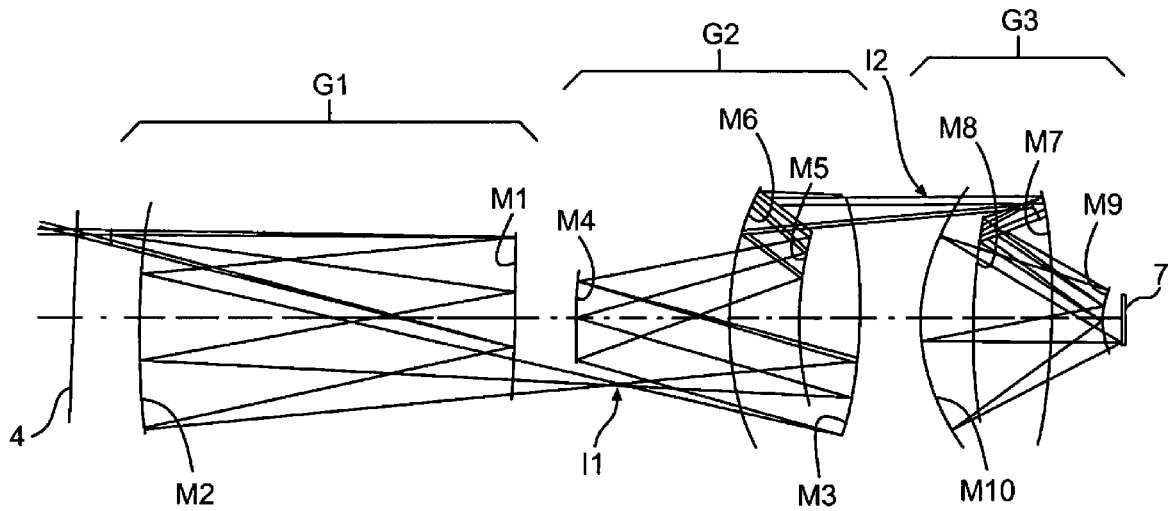

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1, 7 and 14-24 are cancelled.

Claims 2-6 and 8-13 were not reexamined.

\* \* \* \* \*